(12) United States Patent
Aomori

(10) Patent No.: US 7,169,703 B2
(45) Date of Patent: Jan. 30, 2007

(54) METHOD OF FORMING METALLIC WIRING LAYER, METHOD OF SELECTIVE METALLIZATION, APPARATUS FOR SELECTIVE METALLIZATION AND SUBSTRATE APPARATUS

(75) Inventor: Shigeru Aomori, Chiba (JP)

(73) Assignee: Kabushiki Kaisha Ekisho Sentan Gijutsu Kaihatsu Center, Yokohama (JP)

( * ) Notice: Subject to any disclaimer, the term of this patent is extended or adjusted under 35 U.S.C. 154(b) by 226 days.

(21) Appl. No.: 10/508,067

(22) PCT Filed: Mar. 7, 2003

(86) PCT No.: PCT/JP03/02732

§ 371 (c)(1),
(2), (4) Date: Sep. 16, 2004

(87) PCT Pub. No.: WO03/078678

PCT Pub. Date: Sep. 25, 2003

(65) Prior Publication Data

US 2005/0227485 A1 Oct. 13, 2005

(30) Foreign Application Priority Data

Mar. 19, 2002 (JP) ............................. 2002-075623

(51) Int. Cl.
*H01L 21/441* (2006.01)

(52) U.S. Cl. .................... 438/674; 438/30; 427/123; 118/728; 118/620

(58) Field of Classification Search ................ 438/674, 438/680, 681, 30; 427/255.23, 255.28, 255.31, 427/123, 586, 250, 255.15, 255.7; 118/620, 118/641, 728
See application file for complete search history.

(56) References Cited

U.S. PATENT DOCUMENTS

| | | | |
|---|---|---|---|
| 5,246,745 A * | 9/1993 | Baum et al. ................ | 427/586 |
| 5,393,577 A | 2/1995 | Uesugi et al. ............... | 427/586 |
| 2003/0054102 A1 * | 3/2003 | Horikawa ............... | 427/255.28 |
| 2003/0185980 A1 * | 10/2003 | Endo ..................... | 427/255.23 |

FOREIGN PATENT DOCUMENTS

JP 2000-133652 12/2000

* cited by examiner

*Primary Examiner*—M. Wilczewski
(74) *Attorney, Agent, or Firm*—Stoel Rives LLP

(57) ABSTRACT

A method of forming a metallic wiring layer in a selected region of a layer-stacked plate, which includes the first process of introducing gas consisting of organometallic molecules into a reaction chamber having a layer-stacked plate arranged therein, and forming an adsorbed molecular layer composed of the organometallic molecules on the layer-stacked plate; the second process of reducing the concentration of the gas in the reaction chamber or exhausting the reaction chamber, after forming the adsorbed molecular layer; the third process of carrying a light irradiation against a selected region on the layer-stacked plate; the fourth process of removing the adsorbed molecular layer formed in the region other than the selected region, from the layer-stacked plate; and the fifth process of forming a metallic film in the selected region.

21 Claims, 12 Drawing Sheets

(a)

(b)

(c)

(a)

(b)

(c)

(a)

(b)

Cu(hfac)TMVS (a)

(b)

(c)

(d)

(e)

(f)

METHOD OF FORMING METALLIC WIRING LAYER, METHOD OF SELECTIVE METALLIZATION, APPARATUS FOR SELECTIVE METALLIZATION AND SUBSTRATE APPARATUS

This application claims priority under 35 U.S.C. 371 and under 35 U.S.C. 120 from International Application No. PCT/JP03/02732, filed Mar. 7, 2003, which claims priority of Japanese Patent Application No. 2002-75623, filed on Mar. 19, 2002.

BACKGROUND OF THE INVENTION

1. Field of the Invention

The present invention relates to a method of selective metallization in a semiconductor apparatus such as a semiconductor integrated circuit apparatus (referred to as "IC" hereinafter) as well as in a display apparatus such as a liquid display apparatus (referred as to "LCD" hereinafter) having a logic circuit, a scanning circuit, a switching circuit for pixels, and so forth, a method of selective metallization, a substrate apparatus and a method of forming a metallic wiring layer, more particularly, to a method of forming a metallic wiring layer in the region selected on a substrate including a basic substrate such as a semiconductor substrate, a glass substrate, a plastic substrate, and so forth and one or more layers or thin films as stacked on those substrates, a method of forming a metallic wiring layer, a method of selective metallization, an apparatus for selective metallization and a substrate apparatus.

2. Description of Prior Art

In the manufacture of an IC, especially, a large scale integrated circuit apparatus (LSI) and an ultra large scale integrated circuit apparatus (ULSI), a circuit wiring material having a lower resistivity is required in order to obtain the high speed signal transmission in circuits for the purpose of the realization of the high density integration of devices and the high speed operation. Similarly, in the manufacture of a LCD, a circuit wiring material having a lower resistivity is also required in order to meet a demand for increase of the wiring length for a large screen, miniaturization of each semiconductor device for increasing the number of pixels per unit area, installation of a lot of peripheral circuits on a main substrate, monolithic integration with a memory function, and so forth.

Aluminum (Al) having been generally used as the wiring material has a resistivity of about 5 $\mu\Omega$cm and can be formed into a fine pattern. However, if a fine Al wiring pattern is placed under the conditions where there exist the high temperature as well as the high stress, electron transfer and stress take place in the Al wiring pattern and as a result, some of fine Al wires comes to be broken due to migration caused by the above electron transfer and stress. Besides, even if aluminum has such a resistivity as mentioned above, it would set a limit to further improvement of the high speed signal transmission as mentioned above.

Thus, copper (Cu) having a resistivity of about 2 $\mu\Omega$cm and some alloys thereof are watched with interest as a material having a lower resistivity than aluminum. A Cu wiring pattern having the same film thickness as an Al wiring pattern has a lower electric resistance than the Al wiring pattern. Besides, the anti-migration character of the Cu wiring pattern is superior to that of the Al wiring pattern.

As one of methods of forming a Cu wiring pattern using copper as a wiring material, there is known a combination method combining a conventional film forming method and a reactive ion etching (referred to as "RIE" hereinafter) method (referred to as "film forming and etching method" hereinafter). According to this method, a thin copper film is first formed on a substrate or a layer-stacked plate so as to cover the almost all the surface of it and then, the thin copper film formed in a region except the one formed in a region reserved for a predetermined Cu wiring pattern is removed by the aforesaid etching method.

A damascene method is another known method of forming the Cu wiring pattern (e.g., refer to JP Patent Public Disclosure No. 11-135504). According to this method, a groove for wiring use (referred to as "wiring groove" hereinafter) is first formed in an insulating film formed on the surface of the substrate or the layer-stacked plate such that the wiring groove has the same pattern as an objective Cu wiring pattern. Then, a thin copper film is formed within the wiring groove as well as on the surface of the insulating film by means of a sputtering method such as a physical vapor deposition (PVD) method, or of a plating method, or of a chemical vapor deposition (CVD) method using an organometallic material, such that Cu film is formed inside the wiring groove or on the insulating film to fill it adequately. Then, the copper thin film except the one buried in the wiring groove is removed by chemical mechanical polishing method or etch back method, thereby a buried type Cu wiring pattern being formed.

As still another method of forming a Cu wiring pattern, there is known a method wherein there are provided on a substrate or a layer-stacked plate two regions made of two kinds of materials of which conductivities are different from each other and then, a copper thin film is formed only in the conductive region by means of the CVD method (referred to as "conductivity CVD method" hereinafter) (e.g., see the Patent Document 1 as indicated below). According to this method, prior to the selective formation of the copper thin film, in order to form a conductive region, a conductive film is first formed on the substrate or the layer-stacked plate and then, the copper thin film formed in the region other than the aforesaid region is removed by etching. After this, Cu is deposited only on the conductive film formed on the aforesaid region by means of the CVD method.

In the film forming and etching method and the damascene method as described in the above, the copper thin film once formed on almost all the surface of the substrate or the layer-stacked plate is removed except that which is formed in the region constituting the Cu wiring pattern. This not only decreases the Cu use efficiency but also invites a raise in the product cost. Besides, in the conductivity CVD method as described in the above, as the conductive film pattern formation necessary for forming the copper thin film is carried out by means of the conventional film forming method as well as the conventional etching method, the region of the conductive film to be removed becomes larger, which comes to lower the use efficiency of the conductive film material.

In order to obviate the decrement issue in the material use efficiency caused by the method of etching and polishing the conductive film as mentioned above, there has been proposed a photo-chemical reaction method so far (e.g., see the Patent Document 2 as indicated below). This photo-chemical reaction method makes use of decomposition of an organometallic substance by mean of light irradiation to directly form the copper thin film in the form of a wiring pattern on the substrate or the layer-stacked plate.

In this method, first of all, the substrate or the layer-stacked plate (referred to as "a plate to be treated" hereinafter) is placed in a gas of an organometallic raw material and then, a desired region on the plate to be treated is selectively irradiated by a light such as laser beam. The organometallic raw material receiving the light irradiation is photo-decomposed, so that nuclei made up of the metal of the same kind as caused by the photo-decomposition is formed on the surface of the above selected region of the plate to be treated. Then, a metallic film is formed on the above metallic nuclei by means of the CVD method or the electroless plating method. In the time of forming the metallic film, the metal deposition starts from respective metal nuclei and then, the metallic film is formed on the metal nuclei.

Patent Document 1: JP Patent Laid-Open Publn. No. 2-256238.

Patent Document 2: JP Patent Laid-Open Publn. No. 2000-91269 (pp. 4 to 5, FIG. 6).

However, the above photo-chemical reaction method includes the following problem. FIGS. 12(a) and 12(b) of the accompanying drawings are diagrams schematically showing a method of forming a metallic wiring layer by means of the aforesaid photo-chemical reaction method. Now, the process of forming metallic nuclei 804 and a metallic film 808 in a predetermined selected region on a substrate 801 will be explained with reference to FIGS. 12(a) and 12(b). As shown in FIG. 12(a), the organometallic material molecules 802 in the gas atmosphere, which become sources for forming metallic nuclei 804, are introduced into a film deposition chamber and at the same time, the light irradiation 806 is carried out against the surface of the substrate 801 through a mask 807, thereby the photo-decomposition reaction of the organometallic raw material molecules 802 taking place in the gas phase. At this time, metallic atoms 803 caused by the photo-decomposition reaction in the gas phase in the vicinity of the surface of the substrate 801 come to adhere to the surface of the substrate 801 and form metallic nuclei 804 in the selectively light-irradiated region on the substrate 801. However, as the unnecessary metallic atoms 803 also caused by the photo-decomposition of the organometallic raw material molecules 802 in the gas phase consisting thereof are moved within the reaction chamber according to the flow of the gas of the organometallic raw material molecules 802, the metallic atoms 803 do not always adhere to the predetermined selected region on the substrate 801 but come to adhere to the region other than the above selected region, thereby unnecessary metallic nuclei 805 being formed on unselected regions.

As described above, if the metallic film deposition is continuously carried out to the substrate 801 of which the surface includes unnecessary metallic nuclei 805 adhered thereto in unselected surface areas as well as metallic nuclei 804 adhered thereto in selected surface areas by means of the selective CVD method or the electroless plating, as shown in FIG. 12(b), the metallic film 808 grows up on the metallic nuclei 804 in the region selectively defined by the light irradiation 806 and at the same, the metallic film 809 grows up also on the metallic nuclei 805 adhered to the unselected region. As a result, the metallic film 809 comes to be deposited on unnecessary region, and the more fine the wiring pattern becomes, the more the short circuit is caused between wirings with ease. The short circuit in the wiring results in the production of defective semiconductor devices and unacceptable liquid crystal displays.

SUMMARY OF THE INVENTION

Objects of the invention are to provide a method of forming a metallic wiring layer which is formed only in a predetermined selected region, a method of selective metallization, an apparatus for selective metallization, and a substrate apparatus.

The method of forming a metallic wiring layer according to the invention is a method of forming a metallic wiring layer in a selected region on a substrate, comprising: a first process of introducing a gas of an organometallic molecule into a reaction chamber where a layer-stacked plate is arranged therein and forming an adsorbed molecular layer composed of the organometallic molecule on the layer-stacked plate; a second process of reducing a concentration of the gas of the organometallic molecule in the reaction chamber or exhausting the gas, after forming the adsorbed molecular layer; a third process of carrying out a light irradiation onto the selected region on the layer-stacked plate; a fourth process of removing the adsorbed molecular layer formed in a region other than the selected region on the layer-stacked plate, from the layer-stacked plate; and a fifth process of forming a metallic film in the selected region.

According to the invention, after forming the adsorbed molecular layer and exhausting the gas of the organometallic molecule from the reaction chamber or reducing the concentration of the gas of the organometallic molecule, the light irradiation is carried out on a predetermined selected region on the substrate, thereby forming a metallic nucleus consisting of metal constituting the organometallic molecule only in the selected region.

The adsorbed molecular layer is given photon energy by the light irradiation, thereby the organometallic molecule being decomposed to form metallic nucleus.

Prior to the first process, if a light absorbing film made of a light absorbing material is formed on a surface of the layer-stacked plate, the light absorbing material absorbs the light by the light irradiation and comes to generate heat. The thermal energy by the heat generation of the irradiated light absorbing film is given to the adsorbed molecular layer, thereby the organometallic molecule being decomposed and the metallic nucleus being formed.

It is preferable that processes from the first process to the third process or processes from the first process to the fourth process are repeated one or more times.

It is preferable that a way of reducing the concentration of the gas of the organometallic molecule includes either diluting the concentration of the gas of the organometallic molecule or exhausting the gas of the organometallic molecule from the reaction chamber.

The organometallic molecule includes any metal of copper, aluminum, titanium, tungsten, tantalum, and molybdenum.

It is preferable that the metallic film is made of metal or its compound of the same kind as the metallic nucleus and the metallic film is formed by means of a plating method.

It is preferable that the metallic film is made of metal or its compound of the same kind as the metallic nucleus and the metallic film is formed by means of a chemical vapor deposition method.

It is preferable that the metallic film is made of metal or its compound of a different kind of the metallic nucleus and the metallic film is formed by means of a plating method.

It is preferable that the metallic film is made of metal or its compound of a different kind of the metallic nucleus and the metallic film is formed by means of a chemical vapor deposition method.

It is preferable that the metallic film is made of copper or an alloy of copper.

A method of selective metallization according to the invention includes forming a layer made of organometal on a substrate provided in an air shield chamber by introducing an organometallic gas into the air shield chamber; exhausting the organometallic gas in the air shield chamber or reducing a concentration of the organometallic gas; having an optical pattern imaged on the layer made of the organometal on the substrate provided in the air shield chamber, in which the organometallic gas is exhausted or the concentration of the organometallic gas is reduced; and removing a layer made of the organometal and formed in an unselected region without having any optical pattern imaged thereon, from the substrate.

It is preferable that the process of forming a layer made of the organometal includes a process of forming a layer made of the organometal in the state that the substrate is kept at a temperature lower than a vaporization temperature of the organometal.

It is preferable that the process of reducing the concentration of the organometallic gas in the air shield chamber is a process of stopping a supply of the organometallic gas to the air shield chamber, and supplying nitrogen gas or inert gas to the air shield chamber for dilution or exhausting.

It is preferable that the optical pattern is a metallic wiring pattern.

It is preferable that the layer made of the organometal in a region on which the optical pattern is imaged is provided on the substrate in the form of a metallic nucleus by decomposing the organometallic molecule.

It is preferable that the process of removing the layer made of the organometal in the unselected region from the substrate includes keeping the substrate at a temperature between a vaporization temperature and a decomposition temperature both inclusive in the state of being exhausted.

An apparatus for selective metallization according to the invention includes: an air shield chamber; a supporting plate for supporting a substrate for deposition provided in the air shield chamber; a temperature control means provided to control a treatment temperature of the substrate for deposition; an organometallic gas supply means provided to supply organometallic gas into the air shield chamber; and an optical system provided to have an optical pattern imaged on the substrate for deposition.

A substrate apparatus in which metal is selectively formed includes: a metallic nucleus selectively provided on a substrate; and a metallic layer provided on the metallic nucleus.

PREFERRED EMBODIMENT OF THE INVENTION

Some embodiments of the invention will now be described in detail in the following with reference to the accompanying drawings. In the figures referred to for explanation of the invention, a thing having a like function is denoted with a like numeral or sign and the repetitive explanation thereabout will be omitted. Selective formation of a metal is carried out, for example, when forming wirings, electrodes or the like.

In the next, an embodiment of a method of forming a metallic wiring layer according to the invention will now be described. First of all, the principle of the method will be described with reference to FIGS. 1(a) to 1(c) as well as to FIGS. 2(a) to 2(c). A layer-stacked plate 103 is first formed by making a barrier layer on a substrate such as a glass substrate. This layer-stacked plate 103 is mounted on a table arranged in a reaction chamber 101. This reaction chamber 101 is evacuated, for example, the vacuum pressure as $1 \times 10^{-3}$ Pa or less.

Figure 1:
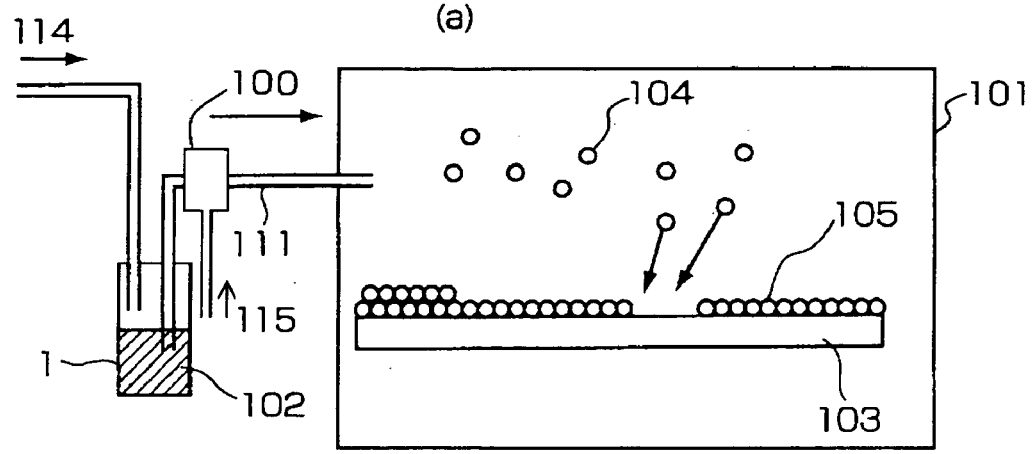
FIG. 1 includes diagrammatic views showing an embodiment of a method of forming a metallic wiring layer according to the invention, wherein respective diagrammatic views (a) to (c) schematically show corresponding processes to be carried out in the above embodiment.
Figure 1:
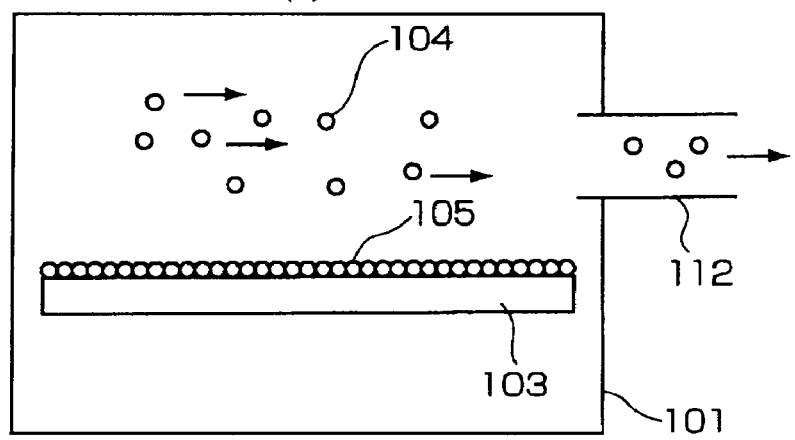
Figure 1:
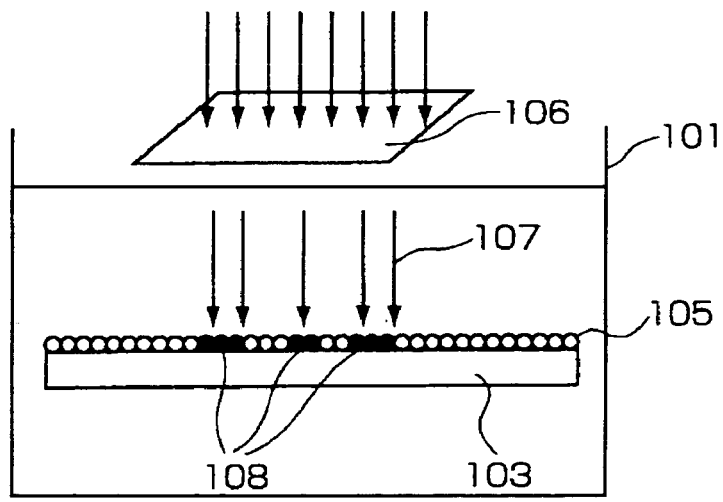
Figure 2:
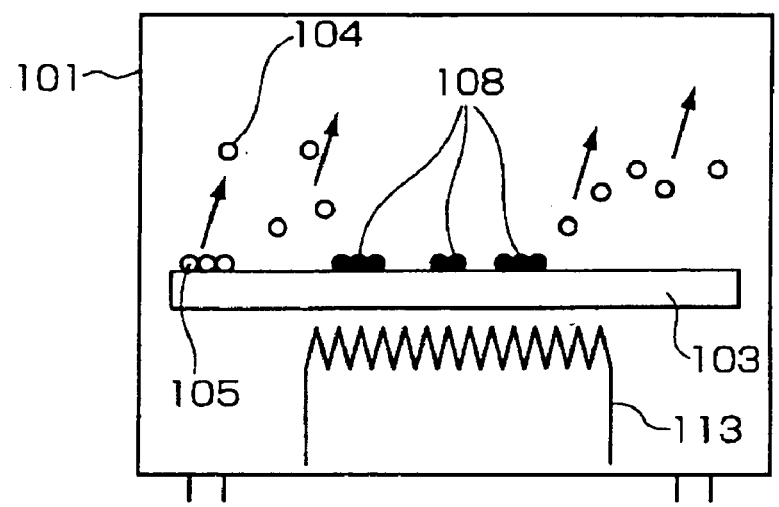
FIG. 2 includes diagrammatic views showing an embodiment of the method of forming a metallic wiring layer according to the invention, wherein respective diagrammatic views (a) to (c) schematically show corresponding processes to be carried out in the above embodiment.
Figure 2:
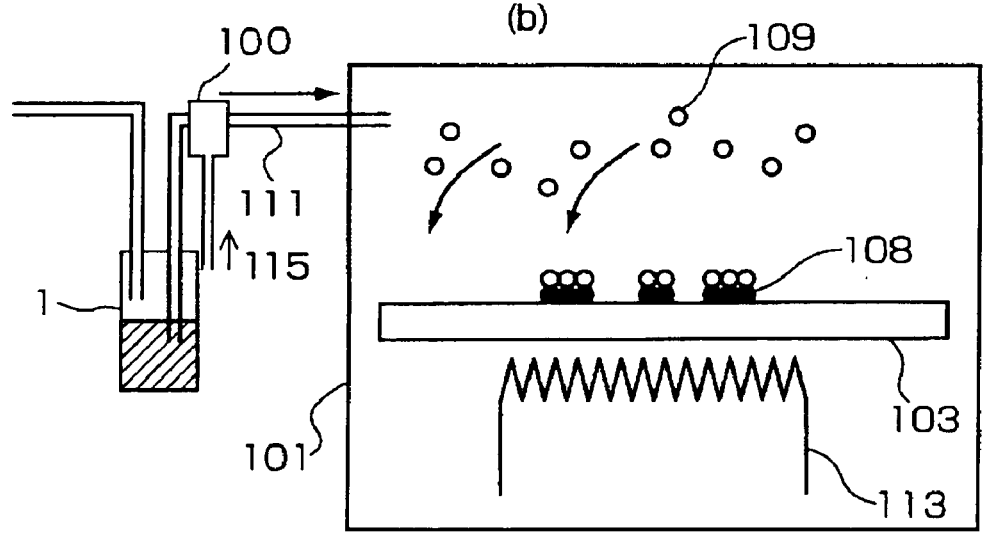
Figure 2:
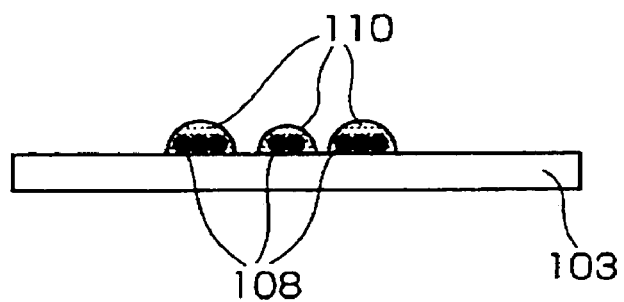

As shown in FIG. 1(a), a organometallic raw material in liquid phase 102 stored in an air shield vessel 1 is sent out by mean of a pressurized gas 114 to a vaporizer 100, in which the organometallic raw material 102 is heated at its vaporization temperature or higher one, for example 40° C. to 70° C., thereby being vaporized. A gas of organometallic molecules 104 as being an organometallic raw material gas is then introduced into the reaction chamber 101 where the layer-stacked plate 103 is mounted by separately introducing a carrier gas 115 such as an inert gas into the vaporizer 100 (the first half of the first process). The gas made up of organometallic molecules 104 introduced into the reaction chamber 101 comes to make contact with the layer-stacked plate 103, thereby an adsorbed molecular layer 105 composed of organometallic molecules 104 being formed on the layer-stacked plate 103 (the second half of the first process). In the next, as shown in FIG. 1(*b*), after forming the adsorbed molecular layer 105, supplying organometallic gas stopped and the reaction chamber 101 is evacuated to reduce the concentration of the organometallic molecules 104 remaining in the reaction chamber 101 (the second process). The concentration of organometallic gas in the second process is a concentration as low as would not cause photodecomposition or deposition in the third process. Furthermore, as shown in FIG. 1(*c*), the light irradiation is carried out against a predetermined selected region of the adsorbed molecular layer 105 formed on the layer-stacked plate 103 (The third process). With this light irradiation, a plurality of metallic nuclei 108 made of metal constituting organometallic molecule of the organometallic raw material 102 are formed in the selected region as irradiated by light. Then, as shown in FIG. 2(*a*), the adsorbed molecular layers 105 formed on the other regions but the selected ones on the layer-stacked plate 103 are removed out of the layer-stacked plate 103 again as a gas of organometallic molecules by heating them at a temperature of 40° C. to 70° C. or higher (The fourth process), and the reaction chamber 101 is evacuated to release such gas. In the next, as shown in FIGS. 2(*b*) and 2(*c*), a metallic film 110 is formed on each of a plurality of metallic nuclei 108 (The fifth process). The irradiation light 107 to be used in the third process has to be selected as a light having a wavelength capable of photo-decomposing the adsorbed molecular layer 105 to produce metallic nuclei. For example, a KrF (krypton fluoride) laser is preferable. In the third process, the method of irradiated selective region by the irradiation light 107 against the layer-stacked plate 103 is carried out, for example, through this mask.

The most suitable temperature of the layer-stacked plate 103 in the second half of the first process is lower than the vaporization temperature of the organometallic raw material in liquid phase 102, for example, 40° C. or lower. In the aforesaid fourth process (FIG. 1(*c*)) wherein the organometallic raw material molecules of the adsorbed molecular layer 105 adsorbed on the surface of the layer-stacked plate 103 are photo-decomposed by the light irradiation, the organometallic raw material gas remaining in the aforesaid gas phase is diluted or removed in the second process. Accordingly, even if the light irradiation is carried out in the third process, there is substantially caused no photo-decomposition reaction of the organometallic raw material molecules in the aforesaid gas phase. Consequently, the metallic nuclei 108 produced by irradiation of the irradiation light 107 are formed only on the selected region on the surface of the layer-stacked plate 103. The metallic film 110 is formed on these metallic nuclei 108. By this film deposition means, the metallic film 110 is selectively formed by utilizing the characteristic shown in FIG. 3.

Figure 3:
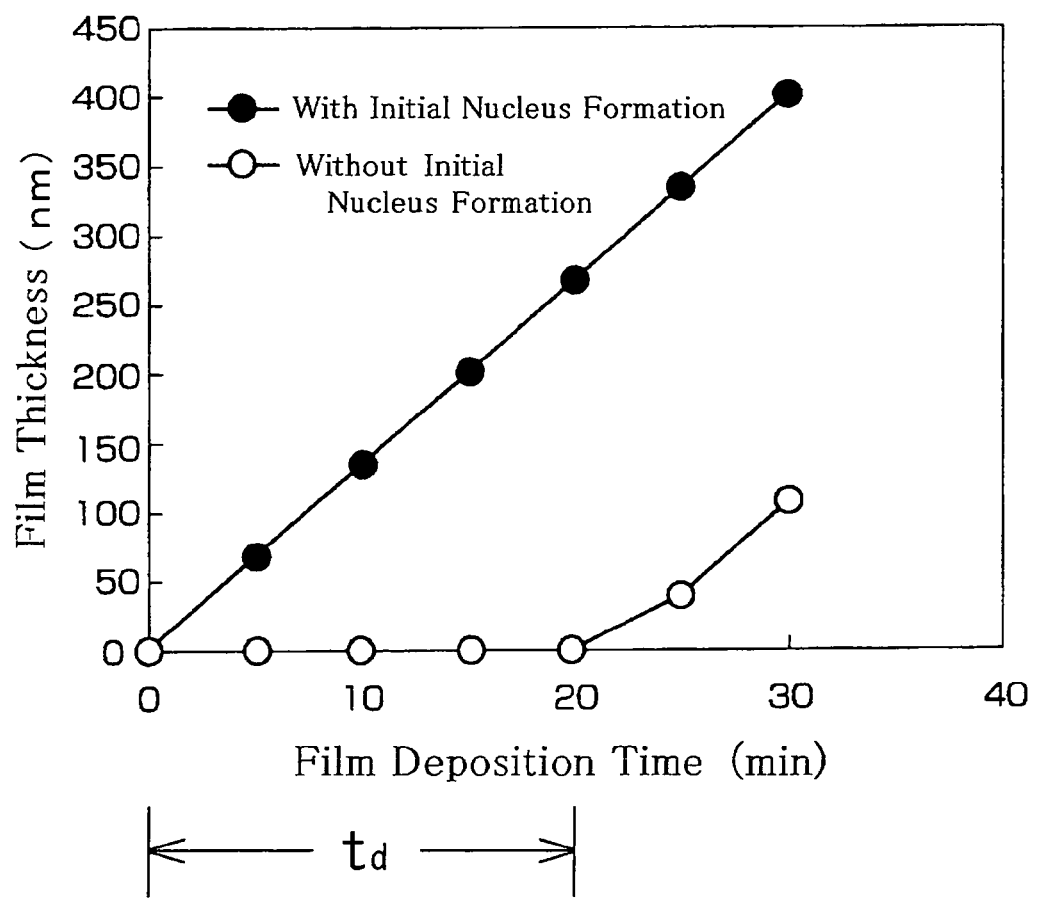
FIG. 3 is a graph indicating a relation between film deposition time and deposited film thickness when depositing a metallic film on layer-stacked plates of which the surface states are different form each other.

FIG. 3 is a graph showing a relation between the metallic film deposition time and the metallic film deposition thickness on layer-stacked plate 103, comparing two surface states of the layer-stacked plate 103 with each other, one surface state including a selected region in which the metallic nuclei are formed and the other surface state including a region in which no metallic nuclear is formed i.e. an unselected region.

When comparing the selected region with the unselected region with regard to the time needed for the metallic film to begin its growth (referred to as "incubation period $t_d$" hereinafter) by using the graph as shown in FIG. 3, it will be understood that there is a time difference of about 20 minutes therebetween. If making use of this characteristic of the incubation period td as indicated in the graph shown in FIG. 3, it becomes possible to form the metallic film 110 only on the metallic nuclei 108 on the layer-stacked plate 103 as shown in FIG. 2(*c*).

In the following, respective processes will be explained in detail with reference to FIGS. 1 and 2.

First of all, as shown in FIG. 1(*a*), the organometallic raw material 102 in liquid phase used as a raw material for forming metallic nuclei and the metallic film is heated at a temperature higher than the vaporization temperature of the aforesaid raw material 102 (e.g., 40° C. to 70° C.). With this heat treatment, the gas pressure of the organometallic raw material 102 is increased, thereby gas composed of organometallic raw material molecules being generated. This organometallic raw material gas is introduced into the reaction chamber 101 together with the carrier gas 115 (e.g., nitrogen gas). The inside wall temperature of a gas introducing path 111 and the reaction chamber 101 is kept at about the vaporization temperature of the organometallic raw material such that these introduced gas neither adheres to the inside wall nor to deposit metal thereon. In the reaction chamber 101 to which the organometallic raw material gas is introduce, there is arranged the layer-stacked plate 103. The organometallic raw material molecule (vaporized molecule) in contact with the layer-stacked plate is adsorbed on the surface of the layer-stacked plate (103) by a adsorption phenomenon i.e. physical adsorption due to a weak intermolecular force such as the Van der Waals force, thereby the adsorbed molecular layer 105 being formed. The adsorbed molecular layer 105 is formed in the form of a mono molecular layer or multiple molecular layers depending on the exposure time of the layer-stacked plate 103 to organometallic raw material gas, the supply quantity of organometallic raw material gas, and so forth.

Molecules of the organometallic raw material gas can freely move about in this gas phase. For example, molecules can deeply go into even a hole-shaped portion such as a contact hole, a trench and so forth, which are formed in the layer-stacked layer 103, and can form adsorbed molecular layers 105 on every inside wall as well as at every corners of the hole-shaped portions by the physical adsorption. Accordingly, it becomes possible to form the adsorbed molecular layer 105 having an excellent coating characteristic.

After forming the adsorbed molecular layer 105 made of the organometallic raw material, as shown in FIG. 1(*b*), the remaining organometallic raw material molecules 104 which are not used for forming the adsorbed molecular layers 105, are exhausted from the reaction chamber 101 through an exhaust opening 112 or exhausted by carrying out a treatment of substituting other inert gas for the organometallic gas existing in the reaction chamber. In this case, it is preferable to completely exhaust the organometallic raw material molecules 104 in the gas phase from the reaction chamber 101. In the light irradiation process as described later, however, the organometallic raw material molecules may still exist in the reaction chamber if its concentration is diluted such that the reaction probability in the gas phase becomes adequately lower. Accordingly, it is of advantage that there is no need for the reaction chamber 101 to be completely vacuumed when carrying out the above-mentioned substitution treatment using other inert gas.

Besides, the adsorbed molecular layer 105 made of molecules 104 of the organometallic raw material gas is rapidly formed as soon as these molecules 104 make contact with layer-stacked plate 103. Therefore, after the organometallic raw material gas is introduced to the reaction chamber 101 and makes contact with the layer-stacked plate 103, in order to speedily exhaust the introduced organometallic raw material gas from the reaction chamber 101, there may be simultaneously carried out the above-mentioned two processes, which are the process of introducing the organometallic raw material gas to the reaction chamber 101 (FIG. 1(a)) and the other being the process of exhausting the organometallic raw material gas or replacing it by the other inert gas (FIG. 1(b)).

Following to the above, as shown in FIG. 1(c), the light irradiation to the molecular layer made of molecules of the organometallic raw material adsorbed on the surface of the layer-stacked plate 103 is carried out through a mask (its opening not shown) by means of a pertinent irradiation light 107 such as a laser beam having a desired shape, thereby the photo-decomposition reaction being caused in the irradiated region. With this process, the metallic nuclei 108 made of metallic atoms deposited by the above photo-decomposition are formed in a desired pattern in the selectively irradiated region of the layer-stacked plate 103. In this case, in the gas phase inside the reaction chamber 101 through which the irradiation light passes, there exists no organometallic raw material reacting with the irradiation light 107, or if there exists any, it exists at such a sufficiently low concentration that the probability of causing the photo-reaction with the irradiation light is very low. Accordingly, molecules 104 of the organometallic raw material can not be photo-decomposed in the gas phase before they reach the surface of the layer-stacked plate 103, thus metallic nuclei 108 made of deposited metallic atoms being not generated in the gas phase.

Figure 6:
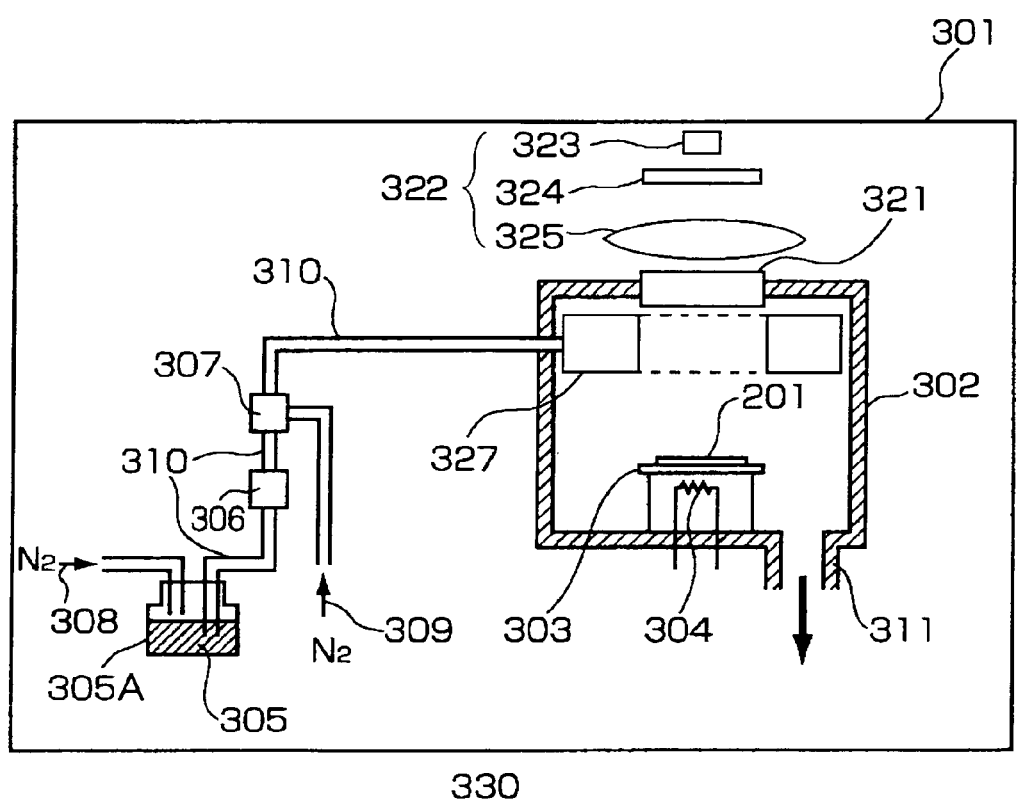
FIG. 6 is a diagrammatic view schematically shows the constitution of a reaction system used in the embodiment 1 of the method of forming a metallic wiring layer according to the invention.

In the above process of forming metallic nuclei 108 by means of the light irradiation, metallic nuclei 108 are formed by photo-decomposing the organometallic raw material molecules forming the adsorbed mono or multiple molecular layers 105 on the surface of the layer-stacked plate 103. In this case, as shown in FIG. 6, the density of the metallic nucleus 108 as formed per region is closely related to the difference in the incubation period td which is the period of time necessary for the metallic film to begin its growth in the selected/unselected region. Because of this, in order to obtain a sufficient metallic nucleus density, it may be possible to repetitively carry out the process of forming metallic nuclei 108 as shown in FIGS. 1(a) to 1(c).

After forming metallic nuclei 108 on the layer-stacked plate 103, as shown in FIG. 2(a), the layer-stacked plate 103 is heated by a heater 113 or the like. With this heat treatment, the organometallic raw material molecules adsorbed on the unselected region are released from restriction by the adsorption phenomenon i.e. the physical adsorption caused by the weak force such as Van der Waals force acting between the organometallic raw material molecules and the surface of the layer-stacked plate 103, thereby being removed from the surface of the layer-stacked plate 103 and exhausted out of the reaction chamber. On the other hand, metallic nuclei 108 deposited on the light irradiated region are not removed from the surface of the layer-stacked plate 103 by this heat treatment. As a result, only nuclei 108 deposited in the light irradiated region remain on the layer-stacked plate 103

In the next, as shown in FIG. 2(b), the CVD method for example using the organometallic raw material is carried out under the condition that the metallic film 110 (FIG. 2(c)) can be deposited on metallic nuclei 108 formed on the layer-stacked plate 103. In the ordinary selective CVD method, the deposition rate of metallic nuclei 108 as formed at the initial stage is different depending on the quality of the material in the selected/unselected region on the surface of the layer-stacked plate 103. Here, metallic nuclei are formed preferentially in the selected region by making use of the above-mentioned difference in the deposition rate. The larger the difference in the period of time until the deposition of metallic nuclei 108 begins (i.e. aforesaid incubation period td) is, the more preferable that is. As described before, FIG. 6 is a graph showing the relation between the film deposition time and the film deposition thickness depending on the difference in the surface state of the under-layer i.e. the layer-stacked plate 103.

According to the invention, as shown in FIG. 2(b), as metallic nuclei 108 are already formed in the selected region on the layer-stacked plate 103 by the light irradiation at the start time of film deposition by means of the CVD method, the metallic film based on the organometallic raw material molecule grows up preferentially on the surface portion made of these metallic nuclei 108. In the unselected region, as no reactive metallic nucleus exists, difference between the incubation period td in the selected region and that in the unselected region can be made larger.

As mentioned before, if the deposition density of the metallic nuclear 108 in the selected region is low, the deposition rate of the metallic film 110 based on this metallic nuclear 108 in the selected region is reduced and difference of the incubation period td is made small. Accordingly, it is preferable to form metallic nuclei at a sufficient density, for example, of $1.8 \times 10^{10}/cm^2$. As described before, the process of forming metallic nuclei 108 of FIGS. 1(a) to 1(c) may be repeated plural times. In this way, the metallic film 110 is formed on the metallic nuclear in the selected region.

Besides, as will be seen from the characteristic graph shown in FIG. 3, as no metallic nucleus 108 for film growth exists in the unselected region, the unintentional partial film growth due to particles and the metallic film is suppressed, thus making it possible to forming the metallic film 110 on metallic nuclei 108 deposited in the form of a predetermined pattern.

In the method of forming the metallic wiring layer according to the invention, the metallic material forming the metallic nucleus 108 and the metallic material of the metallic film 110 grown on this metallic nucleus 108 may be identical to or different from each other. Therefore, the material of the metallic nucleus 108 as the under-layer for the film growth can be selected in the wide range by taking adhesion between the metallic film 110 and the layer-stacked plate 103 into consideration.

Deposition of the metallic film 110 after forming metallic nuclei 108 in the selected region of the layer-stacked plate 103 may be carried out by means of the CVD method or the ordinary plating method.

The difference in incubation period td in the metallic nucleus formation region, that is, the selected and unselected region, as shown in FIG. 3, is unchanged regardless of whether the kind of materials of the metallic nucleus 108 and that of the metallic film 110 as deposited thereon is identical to or different from each other. Accordingly, for example, even if a material having weak cohesiveness to the surface of the under-layer i.e. the layer-stacked plate 103, is unfortunately selected in order to form the metallic film 110 constituting the metallic wiring, there is a way of improving such weak cohesiveness. That is, what is to be done first is to select a metallic material having good cohesiveness to the surface of the layer-stacked plate 103, as a material for forming the metallic nucleus 108. Then, if forming a nucleus layer made of this selected metallic material between the metallic film 110 and the surface of the layer-stacked plate 103, this layer comes to work as an anchor to the layer-stacked plate 103, thereby the improved cohesiveness being obtained. It is desirous to heat the layer-stacked pate 103 receiving the light irradiation in order to achieve excellent closer contact between metallic nuclei and the layer-stacked pate 103.

The light source used for carrying out the light irradiation against the adsorbed molecular layer 105 made of organometal adsorbed on the layer-stacked plate 103 and photo-decomposing the organometallic raw material molecules, thereby forming metallic nuclei in the selected region, has to have photon energy larger than the activation energy for decomposing the organometallic raw material, which can be described by the following equation.

$$E = h\nu = (c/\lambda)$$

In the above equation, h represents the Plank constant, c the speed of light, and λ the wavelength of irradiating light, respectively. As described in the above, for the light irradiation, it is needed to select the light having energy larger than the activation energy for decomposing the organometallic raw material, Furthermore, it is desirous that a metallic material including any metal of copper, aluminum, titanium, tungsten, tantalum and molybdenum is selected as a material for forming the metallic nucleus on the layer-stacked plate 103.

Still further, it is desirous that a metallic material constituting the metallic wiring is copper or an alloy having copper as a main component thereof. As described before, copper is a good material showing a low electric resistance as well as excellent characteristic of anti-migration. If the aforesaid wiring portion is formed by using copper, a low resistance wiring with an excellent characteristic can be obtained.

In the following, the method of forming a metallic wiring layer will be described by way of a concrete embodiment. Needless to say, however, the invention is not limited by this embodiment.

Embodiment 1

Figure 4:
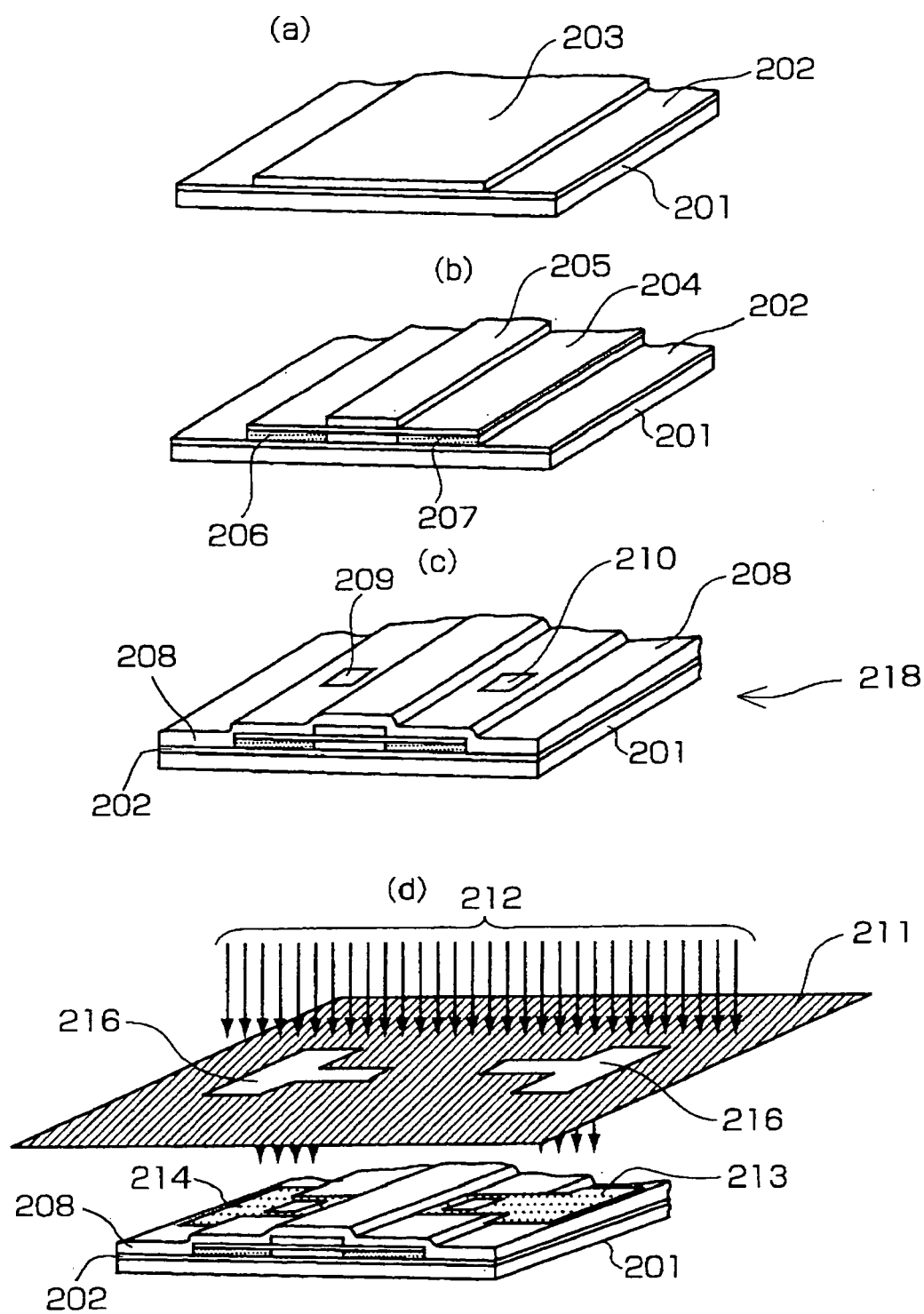
FIG. 4 includes diagrammatic views showing the embodiment 1 of the method of forming a metallic wiring layer according to the invention, wherein respective diagrammatic views (a) to (d) schematically show corresponding processes to be carried out in the above embodiment 1.

As the embodiment 1 according to the invention, there will be described in detail a case where contacts to elements formed on an insulating substrate such as a glass plate and a wiring connected with those contacts are made by using a method of forming a metallic wiring layer, for example, made of copper according to the invention, with reference to FIGS. 4 and 5.

As shown in FIG. 4(a), first of all, a silicon dioxide film (SiO$_2$ film) of 150 nm thick is formed on an alkaliless glass substrate 201 which is used in a liquid crystal display system or the like, by mean of the plasma CVD method. In the next, after forming an amorphous silicon film on the buffer layer 202, polycrystalline silicon (referred to as "Poly-Si" hereinafter) film is formed in the selected region of the Poly-Si film by means of a laser anneal method, a solid phase epitaxial growth method and so forth. After this, there is formed a region composed of a semiconductor layer 203 made of this Poly-Si film. In this embodiment 1, the alkaliless glass is used as the substrate 201, but other materials may be used as the substrate 201 depending on uses, for example, a substrate made of single crystalline silicon, on the surface of which there is formed an insulating film such as a thermal oxide film, a boron-phosphine silicate glass (BPSG) film as a barrier against diffusion of copper, or the like. A conductive material may be also used as a substrate.

Continuing to the formation of the buffer layer 202, as shown in FIG. 4(b), after a SiO$_2$ film as a gate insulating film 204 is formed on the semiconductor layer 203 made of Poly-Si as shown in FIG. 4(a), a gate electrode 205 is sequentially formed on the gate insulating film 204. Then, implantation of impurities and activation of the same are carried out with the help of the gate electrode 205 acting as a mask to form source/drain regions 206, 207 of an element on the semiconductor layer 203, thereby forming the structure of a Poly-Si FET element on the glass substrate 201.

In the next, as shown in FIG. 4(c), a BPSG film as an interlayer insulating film 208 is formed on the above FET element at a film thickness of 300 nm. After this process, in order to connecting the source/drain areas 206, 207 and the aforesaid wiring with each other, contact holes 209, 208 are formed by means of the photolithography and the etching method; Then, barrier metal (not shown) for suppressing the diffusion of copper is formed inside the contact holes. The material acting as barrier metal may be properly selected from materials which is conductive and is capable of suppressing the diffusion of copper, for example a compound of nitrogen such as tantalum nitride (TaN), titanium nitride (TiN) and so forth. In this embodiment, the barrier film made of TaN is formed inside of contact holes 209, 210 at a film thickness of 50 nm.

In the next, the metallic nucleus (metallic nucleus 108 as shown in FIG. 1(c) and FIGS. 2(a) to 2(c)) is formed in the selected region by means of apparatus 301 for selective metallization as shown in FIG. 6.

In FIG. 6, a reference numeral 302 denotes a reaction chamber made by mean of an air shield chamber, 303 a substrate holder, 304 a heater, 305 organometallic raw material liquid contained in an air shield vessel 305A, 305 a liquid flow meter, 307 a vaporizer, 308 pressure gas, for example nitrogen (N$_2$) gas, for sending out the organometallic raw material liquid with pressure, 309 carrier gas, for example nitrogen (N$_2$) gas, for transporting the organometallic raw material gas, 310 a piping through which the organometallic raw material gas flows, 311 an exhaust pipe, and 201 a substrate. A reference numeral 321 indicates a window which allows light for imaging an optical image on the substrate 201 to pass therethrough and is formed in the upper wall of the reaction chamber 302 so as to oppose to the substrate 201. A reference numeral 322 indicates an optical system for imaging a wiring pattern on the substrate 201. This optical system 322 includes a light source 323, a mask 324 in which a predetermined wiring pattern is formed, and optical lens, these three components being arranged on the same optical axis. The light source 323 emits the light having a wavelength capable of changing the adsorbed molecular layer 105 formed on the substrate 201 into nuclei 108 when that layer 105 is irradiated by this light. This light source is a KrF laser generator, for example.

Furthermore, in the reaction chamber 302, there is provided a ring like shower head 327 for diffusing the organometallic gas supplied through the piping 310 uniformly over the entire surface of the substrate 201. This shower head 327 is provided with a lot of small diffusion holes for diffusing the organometallic gas uniformly over the entire surface of the substrate 201. The apparatus for selective metallization is constituted in the way as mentioned above.

In order to obtain the film deposition of good quality without process gas adhered thereto, it is effective to heat the inner wall surface of the reaction chamber 302 as well as the piping 310, for example, at a temperature of 40° C. or more to 70° C. or less. The organocopper raw material as used in this embodiment begins its decomposition at a temperature of 70° C. or more and is liquefied again at a temperature of 40° C. or less. Accordingly, this temperature range is required. This range varies depending on a material, naturally.

Figure 7:
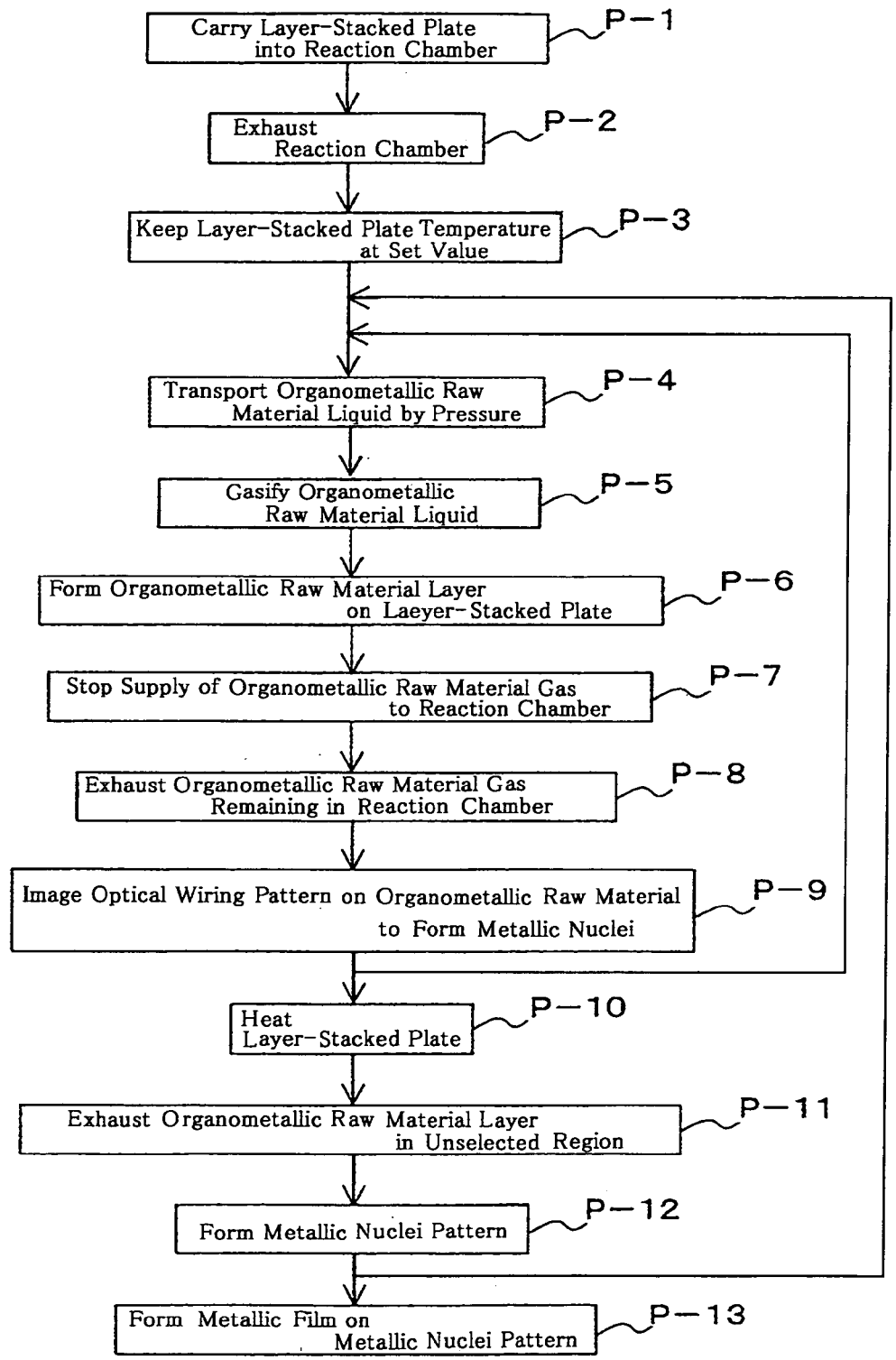
FIG. 7 is a chart of processes carried out in the embodiment 1 of the method of forming a metallic wiring layer according to the invention.

In the next, the method of selective metallization will be explained with reference to apparatus 301 as shown in FIG. 6 and a process flow chart as shown in FIG. 7.

At first, a load-lock room of the reaction chamber 302 is opened and then, the layer-stacked plate 201 is loaded to take a predetermined position on the substrate holder 303 of the reaction chamber 302 (P-1). The reaction chamber 302 is then evacuated up to a predetermined pressure degree of vacuum (P-2). The electric heater is put on to keep the layer-stacked plate, for example, at a temperature of 40° C. or less (P-3). Pressurized inert gas is then supplied into the air shield vessel 305A, thereby the organometallic raw material liquid 305 being transported to the vaporizer 307 with that gas pressure (P-4).

In the vaporizer 307, the transported organometallic raw material liquid is heated, for example, at a temperature of 55° C. or more to be vaporized (P-5) and the gasified organometallic raw material gas is supplied to the shower head 327 through the piping 310. The organometallic raw material gas is diffused in the shower shape into the reaction chamber 302 by the shower head 327, thereby forming a layer made of the organometallic raw material on the layer-stacked plate 201 (P-6).

In the next, the supply of the organometallic raw material gas is stopped, and the organometallic raw material gas remaining in the reaction chamber 302 is exhausted (P-8). The wiring pattern formed in the mask is imaged on the layer made of the organometallic raw material by operating the optical system 322. As the result of this, metallic nuclei are formed in the selected region in which the wiring pattern is imaged (P-9).

In the next, the layer-stacked plate 201 is heated by the heater 304 belonging to the substrate holder 303 (P-10), thereby the layer made of organometallic raw material in the unselected region where no wiring pattern is imaged, being removed and exhausted (P-11) and the wiring pattern made of metallic nuclei being formed on the layer-stacked plate 201 (P-12).

Then, the metallic film is formed on this wiring pattern (P-13) and the process of selective metallization is finished.

In order to form the aforesaid nuclei, a layer-stacked plate 218 having the substrate 201 and aforesaid layer or thin film stacked thereon is set up on the substrate holder 303 in the reaction chamber 302.

Figure 8:
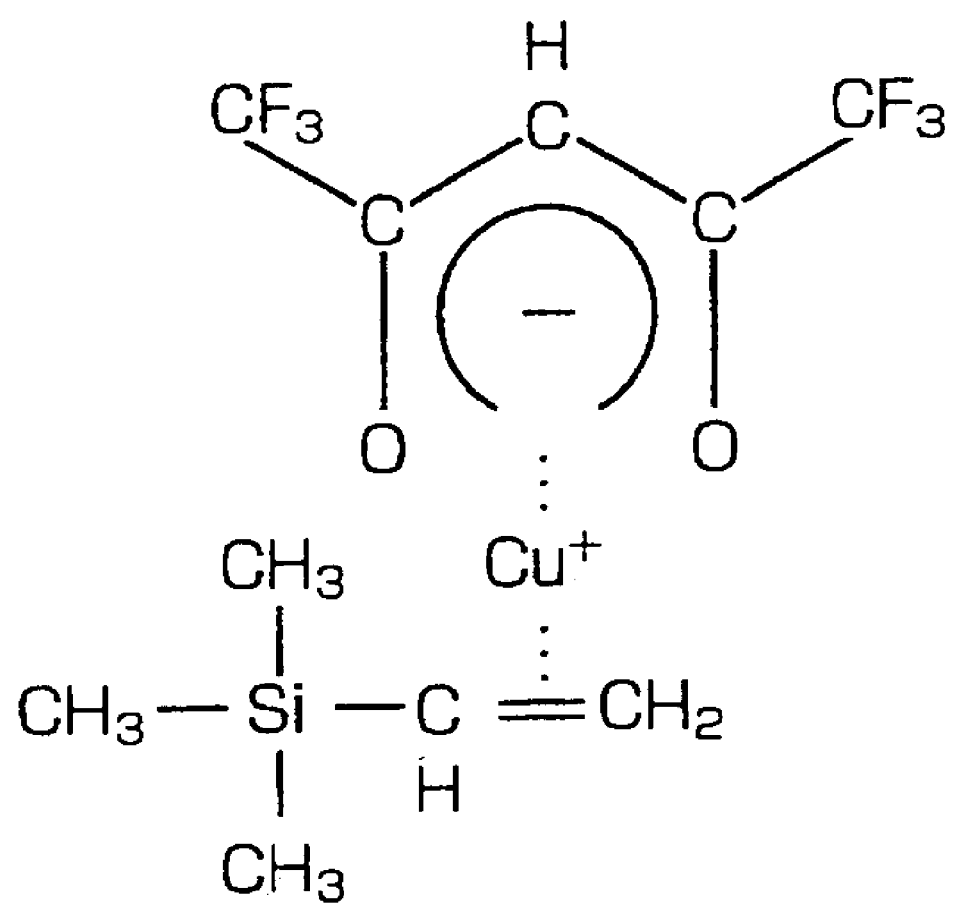
FIG. 8 shows a chemical structural formula of an organocopper raw material used in the embodiment 1 of the method of forming a metallic wiring layer according to the invention.

In this embodiment 1, the organometallic raw material of copper is used for forming nuclei as the organometallic raw material 305 (FIG. 6), to put it more concretely, Cu (hfac) TMVS (hfac: Hexafluoroacetylacetonate, TMVS: Trimethylvinylsilane) is used for forming metallic nuclei. FIG. 8 shows a chemical structural formula of Cu (hfac) TMVS and Table 1 shows properties of Cu (hfac) TMVS. Cu (hfac) TMVS is in the liquid state at a ordinary temperature and an atmospheric pressure, and heating of it increases its vaporization pressure and vaporized it, eventually.

TABLE 1

| Chemical Formula | $C_{10}H_{13}CuF_6O_2Si$ |
|---|---|
| Molecular Weight | 370.83 g/mol |
| Density | 1.37 g/cc |
| Boiling Point | +55° C. |
| Melting Point | +5° C. |

In the thermal CVD method, the layer-stacked plate 218 heated at a temperature of 130° C. or more is made contact with organometallic gas, thereby the above organocopper raw material being decomposed and copper being educed. In the embodiment 1, in order to introduce vaporized Cu(hfac) TMVS into the reaction chamber 302, liquid Cu(hfac) TMVS is sent to the vaporizer 307 while controlling flow rate by liquid mass flow controller 306 from the air shield vessel 305A by nitrogen gas contained in a gas cylinder (not shown). The vaporizer 307 heats liquid Cu(hfac)TMVS, for example, at a temperature of about 40° C. with a heater (not shown) to vaporize Cu(hfac)TMVS. The vaporized Cu(hfac) TMVS is supplied to the reaction chamber 302 with nitrogen gas 309 acting as the carrier gas. At this time, the inner surface of the wall in the reaction chamber 302 except the piping 310 thorough which the vaporized Cu(hfac)TMVS passes, the layer-stacked plate 218 and the substrate holder 303 in the reaction chamber 302 is kept at a temperature of, for example, about 40° C. to 70° C. in order to prevent copper deposition due to adherence of the organocopper raw material to the inner surface of the wall in the reaction chamber. These temperatures are an example when Cu(hfac) TMVS is used as the organometallic raw material, and there is need for these temperature to be properly selected depending on the raw material as used, condition, and so forth.

Vaporized Cu(hfac)TMVS as introduced into the reaction chamber 302 makes contact with the layer-stacked plate 218 set up in the reaction chamber 302 to form an adsorbed molecular layer due to aforesaid physical adsorption (see the adsorbed molecular layer 105 in FIG. 1) on the surface of the layer-stacked plate 218. At this time, a monomolecular layer or multiple molecular layers can be formed on the surface of the layer-stacked plate 218 by controlling the exposure time of the layer-stacked plate 218 to organometallic raw material gas, temperature condition, the supply quantity of organometallic raw material gas as introduced, and so forth.

Besides, as described in this embodiment 1, even if the layer-stacked plate 218 includes, on its surface, contact holes 209, 210 for connection use as formed in the shape of holes or grooves, gas of the organocopper raw material molecules is able to reach even those holes or grooves to be adsorbed there. Accordingly, regardless of the surface shape of the layer-stacked layer 218, the adsorbed molecular layer made of the organocopper molecules can be formed with excellent adherence and coating ability.

In this embodiment 1, the adsorbed molecular layer which is adsorbed on the surface of the layer-stacked plate 218 by making use of the aforesaid physical adsorption, is formed under the condition wherein the substrate temperature substrate is 25° C., the flow quantity for supplying the organometallic raw material i.e. Cu(hfac)TMVS is 0.3 g/min, and the flow quantity of the carrier gas for supplying the vaporized organometallic raw material to the reaction chamber 203 is 300 sccm.

After forming the adsorbed molecular layer made of the organocopper raw material which is adsorbed on the surface of the layer-stacked plate 218 by making use of the aforesaid physical adsorption, the organocopper raw material is exhausted through the exhaust pipe 311 connected with the reaction chamber 302.

Beside, in the process of exhausting the organometallic raw material molecules from the gas phase, introduction and exhaust of the organometallic raw material gas are simultaneously carried out during the formation process of the adsorbed molecular layer by making use of the physical adsorption. After forming the adsorbed molecular layer, the supply of the organometallic raw material gas is stopped and the organometallic gas remaining in the reaction chamber 302 is exhausted.

After finishing the exhaust of the remaining gas, as shown in FIG. 4(d), the adsorbed molecular layer made of organocopper raw material adsorbed on the surface of the layer-stacked plate 218 is irradiated by the irradiation light 212 through a photo mask 211 including openings 216 in the form of a desired wiring pattern, thereby the above pattern of the photo mask 211 being imaged on the surface of the adsorbed molecular layer. Activation energy needed for decomposing the organocopper raw material adsorbed on the surface of the layer-stacked plate 218 varies depending on the state of the surface on which the organocopper raw metal is adsorbed. The activation energy of the organocopper raw material adsorbed on the above layer-stacked plate is in proportion to the resistivity of the surface having molecules adsorbed thereon, that is, decomposition of the organometallic raw material adsorbed on a conductive surface takes place comparatively with ease while decomposition of the organometallic raw material adsorbed on an insulating surface needs higher activation energy.

The organocopper raw material i.e. Cu(hface)TMVS as used in the embodiment 1 needs the activation energy of about 5 to 30 kcal/mol for decomposing it. In case of decomposing the organometallic raw material adsorbed on the surface by light irradiation to form copper nuclei, for example, the wavelength λ of the light having photon energy of 30 kcal/mol is 960 nm or so. Actually, however, when taking the light absorption by the aforesaid organocopper raw material to the wavelength of the irradiation, certain limitations related the optical system, and others, into consideration, it is desirous to use a light source capable of emitting the light having various wavelengths from the visible range to the ultraviolet up to vacuum ultraviolet range.

In the embodiment 1, the light irradiation is carried out by using a light source emitting the KrF (krypton fluoride) excimer laser beams having a wavelength of 248 nm. As the photon energy at a wavelength of 248 nm is about 115 kcal/mol and the organocopper raw material i.e. Cu(hface) TMVS has sufficient light absorption ability, the above laser beams can provide enough energy to decompose the organocopper raw material adsorbed on the surface to form nuclei thereon. Because of these, as shown in FIG. 4(d), when the organocopper raw material layer on the layer-stacked plate 218 is selectively irradiated by the irradiation light 212 through the photo mask 211, there are formed two nucleus formation regions 213, 214. At this time, it is enough for the irradiation light to have the activation energy capable of decomposing the adsorbed molecular layer.

After forming nucleus formation regions 213, 214, the substrate 201 is heated by the heater 304 (FIG. 6) at a temperature lower than the decomposition temperature of the organocopper raw material, thereby removing the non-reacted organometallic raw material molecules from the surface of the layer-stacked plate 218 and at the same time, exhausting the above non-reacted organometallic raw material molecules from the gas phase in the reaction chamber 302 (FIG. 6) to the outside. In the embodiment 1, if the substrate 201 is heated at a temperature of about 50° C., the organometallic raw material molecules as adsorbed on the surface of the layer-stacked plate 218 is removed therefrom without decomposing them and exhausted.

With processes as described above, as shown in FIG. 5, nucleus formation regions 213, 214 including a lot of metallic nuclei made of copper are formed only in the selected regions of the layer-stacked plate 218, to which the selective light irradiation has been carried out. In the regions to which no light irradiation is carried out, as there is caused neither optical nor thermal decomposition of the organocopper raw material, any metallic nucleus can not be formed. Moreover, as there is caused neither optical nor thermal decomposition reaction in the gas phase, any unselective nucleus generation can not be caused on the surface of the layer-stacked plate 218 except the region to which the light irradiation is carried out.

After finishing the metallic nucleus formation process, although the layer-stacked plate 218 may be held as it is, in the same reaction chamber having been used for nucleus formation as it is, it may be transferred to another reaction chamber for performing the CVD deposition of copper. After exhausting this reaction chamber, The substrate 201 is heated at a constant temperature as selected in the range of 130° C. to 200° C. After the temperature of the substrate 201 is stabilized, vaporized Cu (hfac) TMVS which is a raw material for forming a copper film, is introduced into the reaction chamber. For example, when using the system as shown in FIG. 6 according to the invention, the layer-stacked plate 218 is heated, for example, at a temperature of 160° C. by the heater 304 and then, the organometallic raw material is introduced into the system. With this, the thermal CVD process can be carried out by making use of the same system.

Deposition of copper onto the surface of the layer-stacked plate 218 proceeds between metallic nuclei (Cu nuclei) formed on the layer-stacked plate 218 and the organocopper raw material gas according to the following reaction process.

Process 1: When TMVS in the organocopper molecule is decomposed and desorbed in the gas phase, an intermediate product having an atom of monovalent copper oxide: Cu (hfac) (g) is formed and is adsorbed on the surface of the layer-stacked plate.

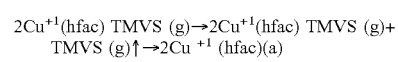
$$2Cu^{+1}(hfac)\ TMVS\ (g) \rightarrow 2Cu^{+1}(hfac)\ TMVS\ (g) + TMVS\ (g)\uparrow \rightarrow 2Cu^{+1}\ (hfac)(a)$$

Process 2: as the activation energy of the organometallic raw material molecule as adsorbed varies depending on the surface conductivity of the layer-stacked plate 218, disproportionation by two organocopper raw material molecules preferentially proceeds to produce one reduced copper atom Cu (g) and a divalent oxidized reaction product in the selected region on the layer-stacked plate 218 on which there are formed initial metallic nuclei made of copper.

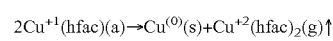
$$2Cu^{+1}(hfac)(a) \rightarrow Cu^{(0)}(s) + Cu^{+2}(hfac)_2(g)\uparrow$$

With the reaction mechanism as indicated above, deposition copper proceeds in the selected region of the layer-stacked plate on which metallic nuclei are formed. As the unselected region on which no metallic nucleus is formed, is made of an insulating material (BPSG), in order to form the nuclei made of the organometallic copper and to grow the film made of the same in the unselected region, the larger activation energy is required comparing with the selected conductive region. Accordingly, as shown in FIG. 3, the incubation period for forming initial metallic nuclei is needed until the copper film is deposited in the unselected region.

As will be seen in FIG. 3, in the selected region where initial metallic nuclei are formed, deposition of the copper film preferentially proceeds as shown with black circles while in the unselected region in which no initial metallic nucleus is formed, it will be understood from white circles as indicate in FIG. 3 that a certain time lag exists until the copper film is recognized. Accordingly, in the reaction system as shown in FIG. 6, if having the organometallic gas adsorbed onto the selected region by making use of the characteristic as shown in FIG. 3, that is, the time lag or the incubation period, the copper film having a desired thickness can be deposited in the selected region in a desired pattern. If this pattern is a wiring pattern, the wiring pattern made of copper is formed.

Figure 5:
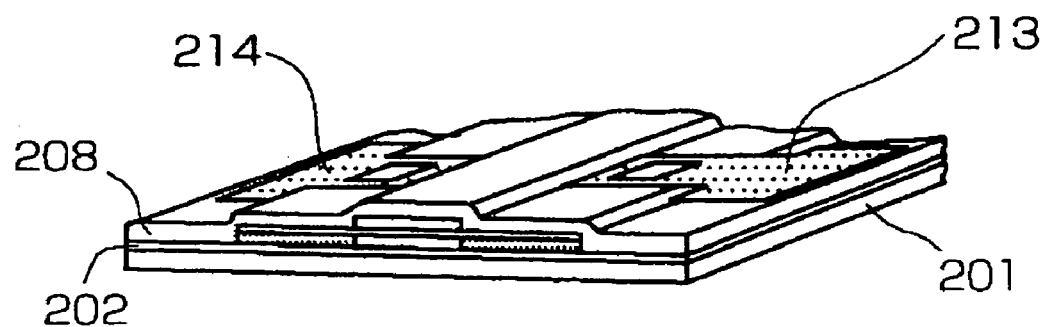
FIG. 5 includes diagrammatic views showing the embodiment 1 of the method of forming a metallic wiring layer according to the invention, wherein respective diagrammatic views (a) and (b) schematically show corresponding processes to be carried out in the above embodiment 1.
Figure 5:
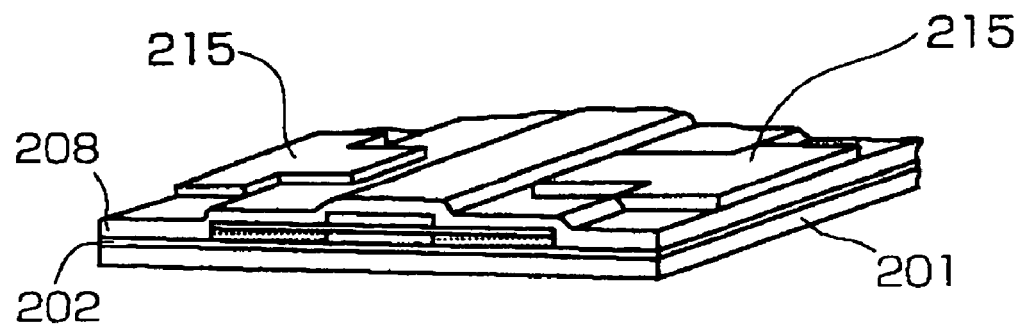

In the embodiment 1, a copper film is formed on the layer-stacked plate 218 on which metallic nuclei are formed by the CVD method under the condition where the pre-heating temperature of the substrate 201 is 170° C. and the deposition pressure is 1 Torr (133 Pa), thereby a metallic wiring 215 (FIG. 5(*b*)) made of a thin copper film of 300 nm thickness being obtained. Beside, it is not recognized that any copper film is formed in the unselected region.

Embodiment 2

In the embodiment 2, a copper film is formed in the selected region on the layer-stacked plate by means of the electroless plating method, the selected region including metallic nuclei formed in the embodiment 1. As the result of examining various plating baths, the following plating solution is used for the electroless plating of copper. For example, copper chloride (II) ($CuCl_2$) (e.g., 0.05 mol/L), cobalt nitrate ($Co(No_3)_2$) (e.g., 15 mol/L), ethylenediamine (e.g., 0.6 mol/L), ascorbic acid (e.g., 0.01 mol/L), surface-active agent, and others. The electroless plating is carried out by setting a temperature of the plating solution and a pH value of the same at 50° C. and at 6.75, respectively and the above layer-stacked plate is dipped into the plating bath for 10 min such that deposited copper forms a copper film of 300 nm thickness.

In the electroless plating bath, the above copper film is deposited in the nuclei formed region by using metallic nuclei made of copper formed in the selected region of the layer-stacked plate as a catalyst, according to the following reaction.

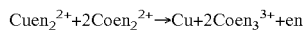

$$Cuen_2^{2+} + 2Coen_2^{2+} \rightarrow Cu + 2Coen_3^{3+} + en$$

Like this, if a thin copper film is formed by carrying out electroless plating to the substrate having metallic nuclei as formed in the selected region thereof, the metallic wiring having a desired pattern can be formed. On the other hand, as described before, in the unselected region, there is formed no metallic nucleus acting as an catalyst in the electroless plating, thus causing deposition of neither copper nor thin copper film being caused.

Embodiment 3

In the embodiment 3, metallic nuclei made of aluminum (Al) are formed as metallic nuclei and then, a metallic film for use in a metallic wiring is deposited based on the above aluminum nuclei by means of the selective CVD method using copper. Advantage of using metallic nuclei made of aluminum is that the aluminum nucleus has stronger adhesion to the layer-stacked plate made of silicon dioxide than metallic nucleus made of copper.

DMAlH (dimethyl aluminum Hydride: $(CH_3)_2AlH$)) is used as an organoaluminum raw material liquid. This raw material is in the liquid state at an ordinary temperature and becomes gas made of the organoaluminum raw material when heating it to raise its vaporization pressure. This DMAlH raw material gas is introduced into the reaction chamber in the same way as in the embodiment 1. If DMAlH gas molecules introduced into the reaction chamber make contact with the layer-stacked plate, an adsorbed molecular layer made of DMAlH molecules is formed on the surface of the layer-stacked plate.

In the embodiment 3, introduction of DMAlH gas into the reaction chamber, contact between gas and the layer-stacked plat, and exhaustion of gas from the reaction chamber are continuously carried out, thereby formation of adsorbed molecular layer on the surface of the layer-stacked plate and the exhaustion of DMAlH gas molecules remaining in gas phase being carried out at the same time.

Finally, after stopping introduction of DMAlH gas into the reaction chamber and exhausting DMAlH gas in the gas phase, adsorbed molecular layer on the surface of the layer-stacked plate is irradiated in the shape of a desired pattern by means of the KrF excimer laser beam, thereby metallic nuclei made of aluminum being formed in the shape of the above pattern on the surface of the layer-stacked plate.

After finishing the process of forming the above metallic nuclei by mean of light irradiation, DMAlH molecules which are once adsorbed on the surface of the layer-stacked plate but not irradiated are heated in the pressure reduced ambience, thereby being desorbed into the gas phase and further exhausted. After this, the copper film is deposited in the region having aluminum nuclei by using the CVD of copper as described in the embodiment 1.

With this, a copper thin film of 300 nm thickness is formed only in the region including metallic nuclei made of aluminum and formed on the layer stacked plate, i.e. selected region, thereby the wiring made of copper being formed.

Embodiment 4

Figure 9:
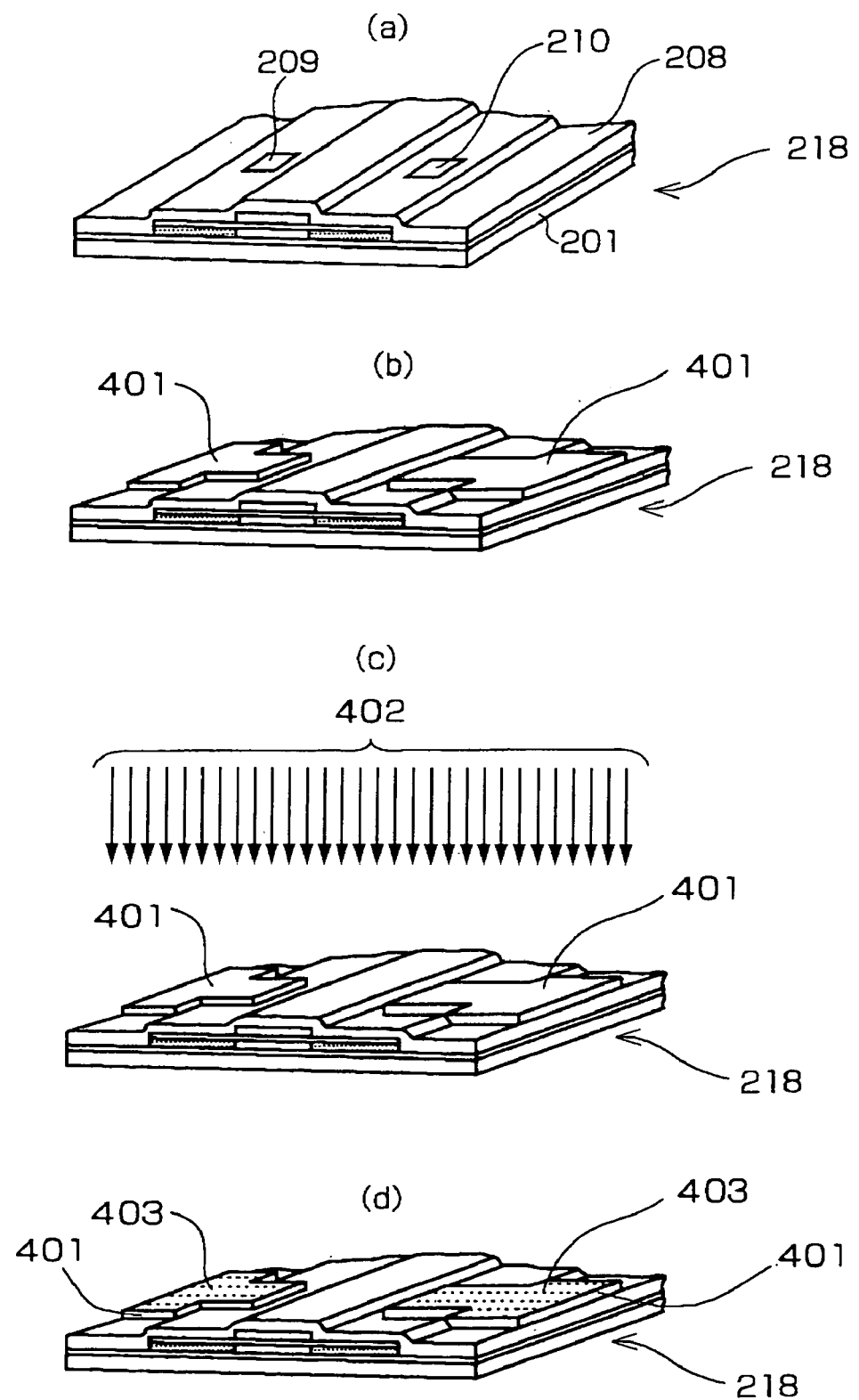
FIG. 9 includes diagrammatic views showing the embodiment 4 of the method of forming a metallic wiring layer according to the invention, wherein respective diagrammatic views (a) to (d) schematically show corresponding processes to be carried out in the above embodiment 4.

In the embodiment 4, before introducing the gas of organometallic raw material 305 into the reaction chamber wherein there is arranged the layer-stacked plate 218 made up of the substrate 201 and aforesaid plurality of layers or thin films which are stacked thereon, a light absorbing film made of light absorbing raw material generating heat when absorbing light, for example, silicon, a silicon-germanium alloy, etc., is formed on the surface of the layer-stacked plate 218. To put it more concretely, as described in the embodiment 1, after forming contact holes 209, 210 as shown in FIG. 9(*a*), the light absorbing film is formed on the almost all the surface of the layer-stacked plate 218, for example, by the physical vapor deposition (PVD) method, and then, the light absorbing film is processed to have a desired pattern, thereby a light absorbing layer 401 being formed.

In the next, the gas of the organocopper raw material 305 is introduced into the reaction chamber 302 of the reaction system 301 as shown in FIG. 6, thereby a adsorbed molecular layer made of the molecules of the organocopper raw material gas (referred to as "organocopper raw material layer" hereinafter) is formed on the surface of the light adsorbing layer as well as of the layer-stacked plate 218. After this, there is exhausted the remaining organocopper raw material gas in the gas phase inside the reaction chamber 302.

After completing the above exhaustion, the entire surface of the organocopper raw material layer is irradiated by the irradiation light 402. At this time, the light absorbing layer 401 absorbs the irradiation light 402 passing through the organocopper raw material layer and generates heat. This heat generation by the light absorbing layer 401 raises the temperature of the organocopper raw material layer on the light absorbing layer 401, by which a chemical reaction is caused in the organocopper raw material, thereby a plurality of metallic copper nuclei being formed.

In the next, in the like manner as described above, the layer-stacked plate 218 is heated by the heater 304 (FIG. 6) at a temperature lower than the decomposition temperature of the organocopper raw material. With this heating treatment, the organocopper raw material molecules (not yet causing chemical reaction) adsorbed on the surface other than the light absorbing layer 401 are released from the binding force due to the physical adsorption, desorbed from the above surface, and exhausted from the reaction chamber 302. In this way, as shown in FIG. 9(*d*), metallic copper nuclei 403 come to remain on the light absorbing layer 401 of the layer-stacked plate 218.

The copper thin film may be formed by making use of metallic copper nuclei 403 as the starting point of the thin film growth and by means of the electro copper plating method.

Embodiment 5

Figure 10:
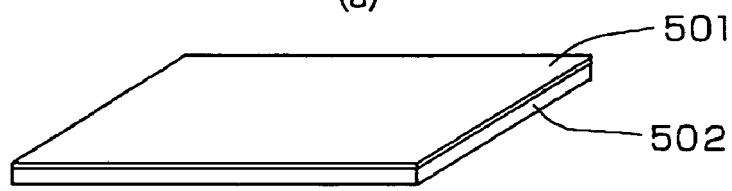
FIG. 10 includes diagrammatic views showing the embodiment 5 of the method of forming a metallic wiring layer according to the invention, wherein respective diagrammatic views (a) to (f) schematically show corresponding processes to be carried out in the above embodiment 5.
Figure 10:
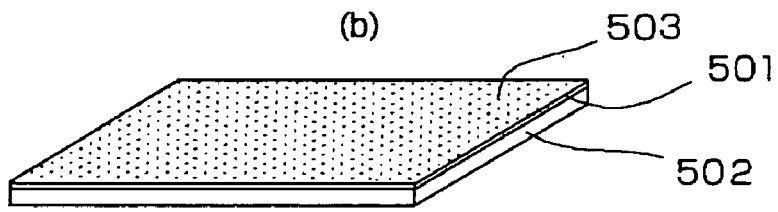
Figure 10:
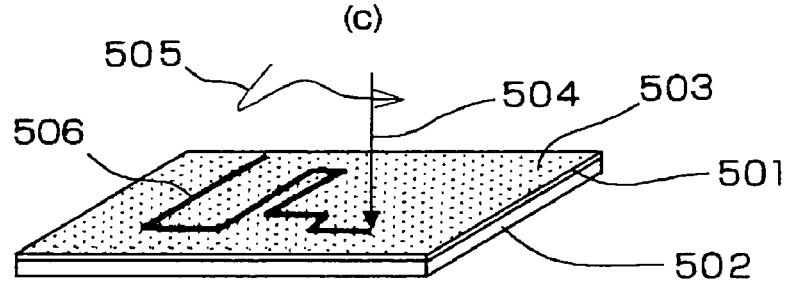
Figure 10:
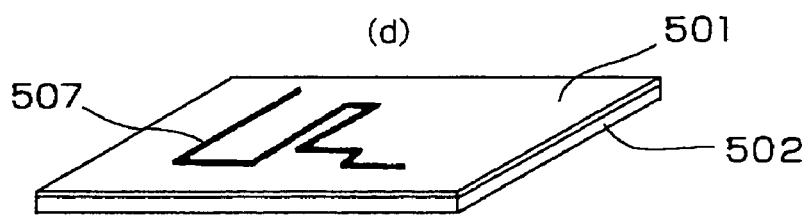
Figure 10:
Figure 10:

In the embodiment 5 also, before introducing the gas of organometallic raw material 305 into the reaction chamber, a light absorbing film 501 is formed on the surface of the layer-stacked plate 502. For example, similar to the case of the substrate as shown in FIG. 9(*a*) as described in the embodiment 4, a light absorbing film 501 as shown in FIG. 10(*a*) is formed on the almost all the surface of the layer-stacked plate 502 by the physical vapor deposition (PVD) method. To simplifying the description, in the example as shown in FIG. 10, the layer-stacked plate 502 is shown as one substrate.

In the embodiment 5, it is not necessary to process the light absorbing film 501 in a desired pattern. As shown in FIG. 10(*b*), after forming the organocopper raw material layer 503 on the light absorbing film 501 which is formed to cover almost all the surface of the layer-stacked layer 502, there is exhausted the remaining organocopper raw material gas floating in the gas phase inside the reaction chamber 302 as shown in FIG. 6.

After completing the above exhaustion, the organocopper raw material layer 503 formed on the light absorbing film 501 is scanned by the irradiation light 504, for example, along a scanning path 505 as shown in FIG. 10(*c*). At this time, the light absorbing film 501 absorbs the irradiation light 504 passing through the organocopper raw material layer 503 at the irradiated portion 506 and generates heat. This heat generation at the portion of the light absorbing film 501 corresponding to the irradiated portion 506 raises the temperature of the organocopper raw material layer 503 on the portion of the light absorbing film 501, by which a chemical reaction is caused in the organocopper raw material, thereby metallic copper nuclei being formed.

In the next, in the like manner as described above, the layer-stacked plate 502 is heated by the heater 304 (FIG. 6) at a temperature lower than the decomposition temperature of the organocopper raw material. With this heating treatment, the organocopper raw material molecules (not yet causing chemical reaction) adsorbed on the surface other than the light irradiated portion 506 are released from the binding force due to the physical adsorption, desorbed from the above surface of the layer-stacked plate 502, and exhausted from the reaction chamber 302. In this way, a metallic copper nucleus layer 507 is formed as shown in FIG. 10(*d*).

Furthermore, as shown in FIG. 10(*e*), the copper thin film 508 is formed by means of the electro copper plating method, using the metallic copper nuclei layer 507 as the starting point of the thin film growth. After this, as shown in FIG. 10(*f*), the portion of the light absorbing film 501 where no thin copper film 508 is formed, is removed by etching, making use of the copper thin film 508 as an etching mask.

In the embodiment 4 and also in the embodiment 5, the adsorption process of organocopper raw material gas, the light irradiation process, and the formation process of metallic copper nuclei may be repeated a plurality of times in response to need. Besides, it is preferable that the irradiation light has such a wavelength that the light absorbing film can generates heat when absorbing it and also, it is preferable that the irradiation light has such a wavelength that the organocopper raw material does not absorb it. It is possible for at least one of the irradiation light wavelength, the light absorbing material, and the organocopper raw material to satisfy the above conditions.

In the example as shown in FIG. 9, in order to connect the source/drain region 206, 207 in contact holes 209, 210 with the wiring, a conductive material such as silicon or an alloy of silicon-germanium is used. If there is no need for any electric connection via the above contact holes to be provided, a dielectric material can be used as the light absorbing material.

Embodiment 6

If deposition of a metal on the substrate causes no problem, the metal can be directly formed on the surface of the substrate.

Embodiment 7

In the above embodiment, with regard to the formation of metallic nucleus pattern by using the mask, the example using a positive pattern is explained, but the metallic nucleus pattern may be formed by using a negative pattern. This embodiment will be described referring to FIG. 11.

Figure 11:
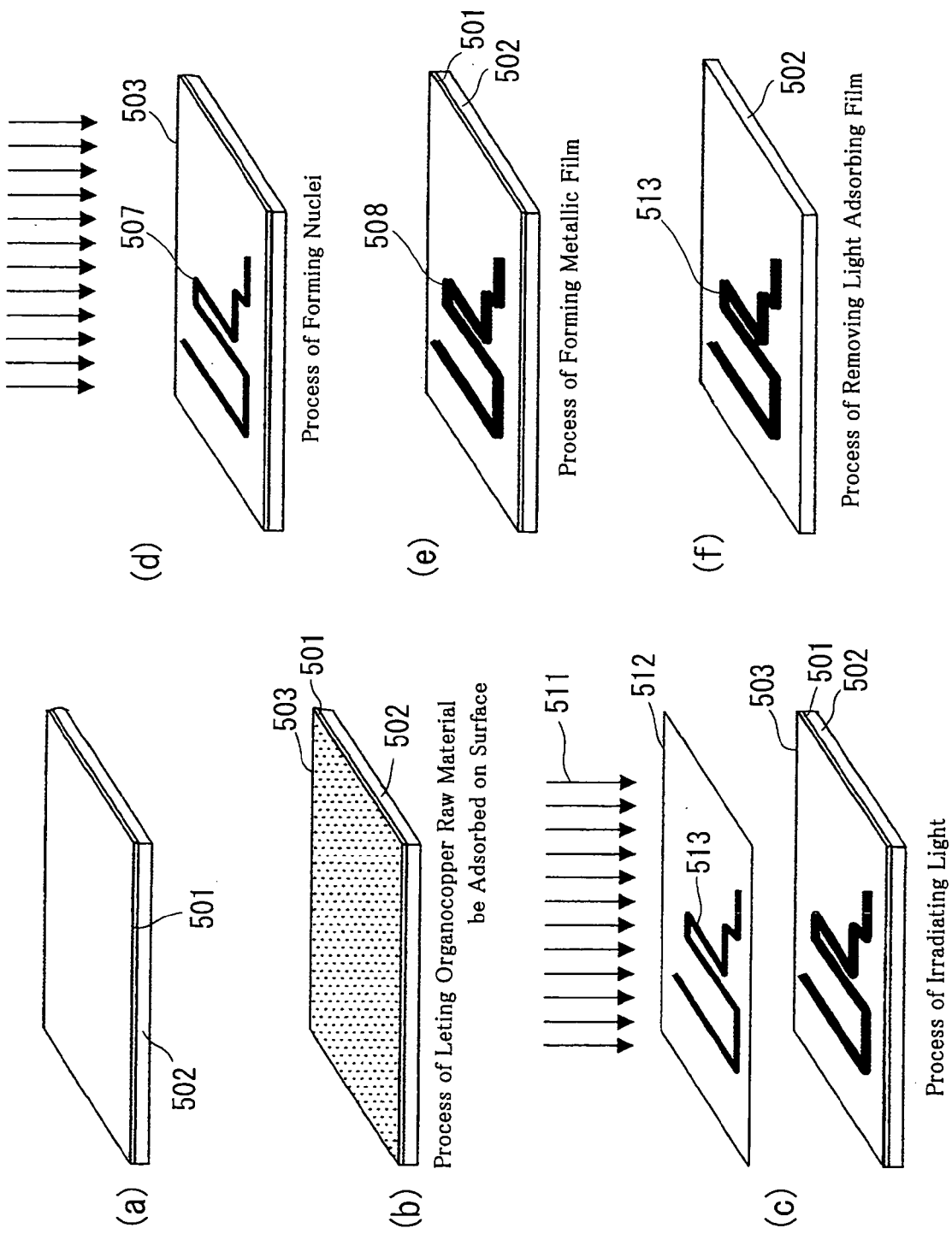
FIG. 11 includes diagrammatic views showing the embodiment 7 of the method of forming a metallic wiring layer according to the invention, wherein respective diagrammatic views (a) to (1) schematically show corresponding processes to be carried out in the above embodiment 7.
Figure 12:
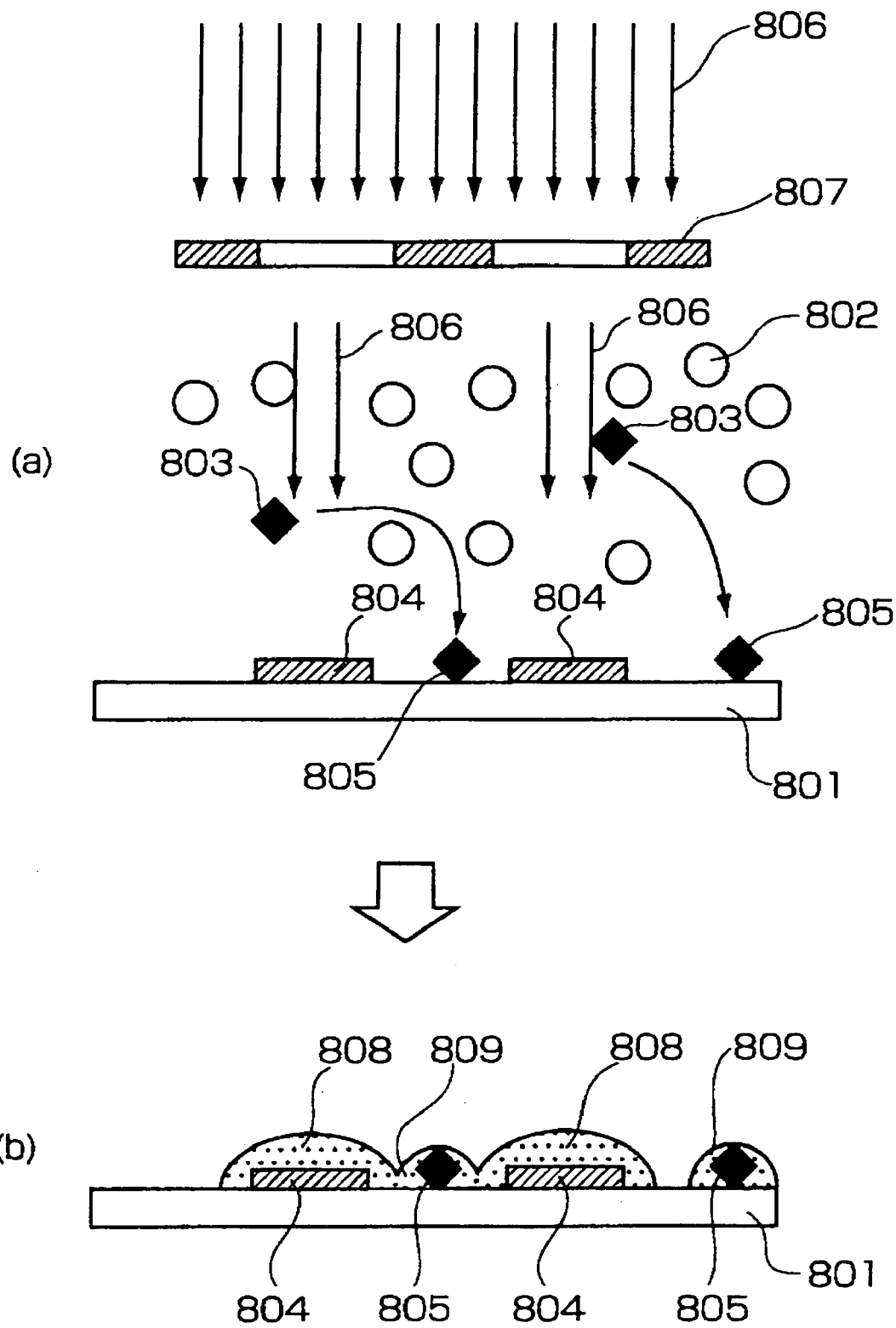
FIG. 12 includes diagrammatic views showing a conventional method of forming a metallic wiring layer, wherein respective diagrammatic views (a) and (b) schematically show the method of forming a metallic wiring layer using the conventional light reaction method.

In the embodiment 7 also, before introducing the gas of organometallic raw material 305 into the reaction chamber, a light absorbing film 501 is formed on the surface of the layer-stacked plate 502 as shown in FIG. 11(*a*). Then, as shown in FIG. 11(*b*), after forming a layer 503 made of organocopper raw material on this light absorbing film 501 on the layer-stacked plate 502 in the reaction chamber 302, there is exhausted the remaining organocopper raw material gas floating in the gas phase inside the reaction chamber 302.

After completing the above exhaustion, in this embodiment 7, in order to desorb the organocopper raw material in the unnecessary portion, the layer 503 made of the organocopper raw material is irradiated by irradiation light 511 through a mask 512 such as a negative pattern 513 showing a wiring pattern as shown in FIG. 11(*c*). At this time, the portion of the light absorbing film 501 corresponding to the region irradiated by light through the negative pattern 513 absorbs the irradiation light and generates heat. In this case, the heat generation temperature is controlled by adjusting the wavelength as well as the quantity of the irradiation light to become a vaporization temperature (e.g., 40° C. to 70° C.). With this, the layer 503 made of the organocopper raw material comes to remain on the not irradiated portion on the layer-stacked plate 502.

Furthermore, in order to decompose this layer 502 made of the remaining organocopper raw material and to form metallic copper nuclei, the light irradiation is carried out against the entire surface of the layer-stacked plate 502 as shown in FIG. 11(*d*). In this time, the irradiation light may be selected such that, as shown in the embodiment 1, it has the wavelength and the irradiation quantity by which the layer 503 made of the organocopper raw material can be decomposed, or may be selected such that, as shown in the embodiments 4 and 5, it is absorbed by the light absorbing layer 501 and generates heat by which the layer 503 made of the organocopper raw material is decomposed. With this light irradiation, the layer 503 made of the organocopper raw material is decomposed, thereby the organocopper nucleus layer 507 being formed as shown in FIG. 11(d).

Still further, in the same manner as the aforesaid embodiment, a metallic thin such as a thin copper film 508 is formed by using the metallic copper nucleus layer 507 as the starting point (seed) of the thin film growth (FIG. 11(e)). After this, the light absorbing film 501 is removed by the etching method using the thin copper film 508 as a mask, thereby a copper wiring pattern 513 being formed as shown in FIG. 11(f).

Embodiment 8

In the embodiment 8, a copper film is formed by means of the electro plating method using the layer-stacked plate including metallic nuclei formed in the selected region according to the embodiment 1. In the embodiment 8, the plating is carried out by using a plating solution consisting of, for example, copper sulfate ($CuSO_4$): about 50 [g/L], sulfuric acid: 50 [g/L], chloric ion concentration: 50 [ppm], and additives, at a temperature of 20° C., and with a current density of 10 mA/cm$^2$, thereby forming a copper film of 300 nm thick.

In the deposition reaction of copper in the electro plating, a seed layer made of copper is first formed as a under-layer and then, the deposition reaction proceeds by using the above seed layer as a catalyst. It is known that no copper film can be deposited by the electro plating as far as no copper exists in the under-layer.

In case of this embodiment, as metallic nuclei made of copper are selectively formed on the layer-stacked plate and the electrolytic plating is carried out by using those nuclei, a copper film to be used as wirings is deposited only in the selected region.

According to the invention, the metallic film 110 (FIG. 2) is formed on metallic nuclei 108 by means of the plating or CVD method, the metallic nuclei 108 being formed only in the selected region on the layer-stacked plate 103. Thus, a metallic wiring having a desired wiring shape can be formed only in the selected region.

Furthermore, if a material of a metallic film for use in a metallic wiring is made of copper or an alloy of which main component is copper, it become possible to form a metallic wiring having a low resistance in a wiring as well as excellent anti-migration characteristic only in the selected region.

While some embodiments of the invention have been shown and described in detail and concretely with reference to the accompanying drawings, the invention is not limited to those embodiments. Various changes and modifications will be naturally possible without departing from the gist of the invention.

According to the invention, there is provided a method of forming a metallic wiring layer, wherein the metallic wiring layer is formed only in the selected region on the layer-stacked plate.

What is claimed is:

1. A method of forming a metallic wiring layer in a selected region of a substrate, comprising:
    a first process of introducing a gas of an organometallic molecule into a reaction chamber where a layer-stacked plate is arranged therein and forming an adsorbed molecular layer including the organometallic molecule on the layer-stacked plate;
    a second process of reducing a concentration of the gas of the organometallic molecule in the reaction chamber after forming the adsorbed molecular layer;
    a third process of light irradiating the selected region of the layer-stacked plate;
    a fourth process of removing from the layer-stacked plate the adsorbed molecular layer formed in a region other than the selected region of the layer-stacked plate; and
    a fifth process of forming a metallic film in the selected region of the layer-stacked plate.

2. A method as claimed in claim 1, wherein the adsorbed molecular layer on the selected region is irradiated with photon energy such that the organometallic molecule decomposes to form a metallic nucleus which is a component of the organometallic molecule.

3. A method as claimed in claim 1, further comprising a process of forming on the surface of the layer-stacked plate a light absorbing film made of a light absorbing material that generates thermal energy when absorbing light, the light absorbing film positioned in proximity to the adsorbed molecular layer such that at least some of the organometallic molecules in the adsorbed molecular layer are decomposed and a metallic nucleus is formed, the process of forming the light absorbing film occurring prior to the first process.

4. A method as claimed in claim 1, wherein the first process through the third process comprises a first series and the first process through the fourth process comprises a second series and one of the first series and the second series is repeated one or more times.

5. A method as claimed in claim 1, wherein the second process of reducing the concentration of the gas of the organometallic molecule in the reaction chamber involves exhausting the gas of the organometallic molecule from the reaction chamber.

6. A method as claimed in claim 1, wherein the organometallic molecule is selected from a group of metals consisting essentially of copper, aluminum, titanium, tungsten, tantalum, and molybdenum.

7. A method as claimed in claim 2, wherein the metallic film is made of the same type of metal as the metallic nucleus and the metallic film is formed by a plating method.

8. A method as claimed in claim 2, wherein the metallic film is made of the same type of metal as the metallic nucleus and the metallic film is formed by a chemical vapor deposition method.

9. A method as claimed in claim 2, wherein the metallic film is made of a different type of metal from the metallic nucleus and the metallic film is formed by a plating method.

10. A method as claimed in claim 2, wherein the metallic film is made of a different type of metal from the metallic nucleus and the metallic film is formed by a chemical vapor deposition method.

11. A method as claimed in claim 1, wherein the metallic film includes one of copper or a copper alloy.

12. A method of selective metallization, comprising:
    introducing an organometallic gas into an air shield chamber including a substrate and thereby forming on the substrate a layer made of an organometal;
    reducing a concentration of the organometallic gas in the air shield chamber;
    imaging an optical pattern onto at least a region of the layer made of the organometal; and removing the layer made of the organometal from an unselected region of the substrate that does not include an optical pattern imaged thereon.

13. A method as claimed in claim 12, wherein introducing an organometallic gas into the air shield chamber includes maintaining the substrate at a temperature lower than a vaporization temperature of the organometal.

14. A method as claimed in claim 12, wherein reducing the concentration of the organometallic gas in the air shield chamber involves stopping the introduction of the organometallic gas into the air shield chamber and introducing one of nitrogen gas or an inert gas into the air shield chamber, thereby diluting the concentration of the organometallic gas in the air shield chamber.

15. A method as claimed in claim 12, wherein a portion of the layer made of the organometal that is formed in the region on which the optical pattern is imaged is formed on the substrate by decomposing the organometallic molecule and forming a metallic nucleus.

16. A method as claimed in claim 12, wherein the optical pattern is a metallic wiring pattern.

17. A method as claimed in claim 12, wherein a portion of the layer made of the organometal that is formed in the region on which the optical pattern is imaged is formed on the substrate by decomposing the organometallic molecule and forming a metallic nucleus.

18. A method as claimed in claim 12, wherein removing the layer made of the organometal from the unselected region of the substrate includes maintaining the substrate at a temperature between a vaporization temperature and a decomposition temperature.

19. An apparatus for selective metallization, comprising:
an air shield chamber;
a supporting plate for supporting a substrate provided in the air shield chamber;
a temperature control means provided to control a treatment temperature for the substrate;
an organometallic gas supply means that supplies an organometallic gas into the air shield chamber; and
an optical system capable of imaging an optical pattern onto the substrate.

20. A method of forming a metallic wiring layer on a selected region of a substrate, comprising:
introducing an organometallic gas into a reaction chamber containing a layer-stacked plate such that an adsorbed molecular layer composed of molecules of the organometallic gas is formed on the layer-stacked plate;
light irradiating and photo-decomposing the adsorbed molecular layer in the selected region; and
heating the adsorbed molecular layer such that a thermal CVD of a metallic film is formed on the adsorbed molecular layer.

21. A method of forming a metallic wiring layer on a selected region of a substrate, comprising:
introducing an organometallic gas into a reaction chamber containing a layer-stacked plate and forming an adsorbed molecular layer composed of molecules of the organometallic gas on the layer-stacked plate; and
light irradiating and photo-decomposing the selected region of the substrate; and
plating a metallic film onto the adsorbed molecular layer by heating the adsorbed molecular layer.

* * * * *